United States Patent
Hass et al.

(10) Patent No.: US 8,084,086 B2
(45) Date of Patent: Dec. 27, 2011

(54) RELIANT THERMAL BARRIER COATING SYSTEM AND RELATED METHODS AND APPARATUS OF MAKING THE SAME

(75) Inventors: Derek D. Hass, Charlottesville, VA (US); Haydn N. G. Wadley, Keswick, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1046 days.

(21) Appl. No.: 11/917,585

(22) PCT Filed: Jun. 30, 2006

(86) PCT No.: PCT/US2006/025978
§ 371 (c)(1),
(2), (4) Date: Dec. 14, 2007

(87) PCT Pub. No.: WO2007/005832
PCT Pub. Date: Jan. 11, 2007

(65) Prior Publication Data
US 2008/0220177 A1      Sep. 11, 2008

Related U.S. Application Data

(60) Provisional application No. 60/695,348, filed on Jun. 30, 2005.

(51) Int. Cl.
C23C 16/00       (2006.01)
H05H 1/24        (2006.01)
B01J 19/08       (2006.01)
G21H 1/00        (2006.01)
G21H 5/00        (2006.01)
H01F 41/00       (2006.01)
B05D 1/04        (2006.01)
H05C 1/00        (2006.01)

(52) U.S. Cl. ............. 427/248.1; 427/569; 427/457; 427/458

(58) Field of Classification Search ........... 427/248.1, 427/569, 457, 458
See application file for complete search history.

(56) References Cited

U.S. PATENT DOCUMENTS

| | | | | |
|---|---|---|---|---|
| 5,169,674 A | * | 12/1992 | Miller | 427/456 |
| 2003/0203127 A1 | * | 10/2003 | Bruce et al. | 427/596 |
| 2005/0019491 A1 | * | 1/2005 | Spitsberg et al. | 427/248.1 |

FOREIGN PATENT DOCUMENTS

| WO | WO 2004011688 A2 * | 2/2004 |
|---|---|---|
| WO | WO 2004043691 A1 * | 5/2004 |
| WO | WO 2004048632 A2 * | 6/2004 |

* cited by examiner

Primary Examiner — Kelly M Gambetta
(74) Attorney, Agent, or Firm — Novak Druce DeLuca + Quigg LLP; Robert J. Decker

(57) ABSTRACT

A method and apparatus for forming a thermal barrier coating system (90) in communication with at least a portion of at least one substrate (92). The method includes: depositing a first bond coat (94) on at least a portion of at least one substrate (92); depositing a first thermal barrier coat (96) disposed on the bond coat (94); whereby the deposition occurs in one or more chambers to form the thermal barrier coating system (90); and wherein the deposition of the first bond coat (94) (or subsequent bond coats) and the deposition of the first thermal barrier coat (96) (or subsequent thermal barrier coats) is performed without out-of-chamber handling of the thermal barrier coating system (90).

63 Claims, 9 Drawing Sheets

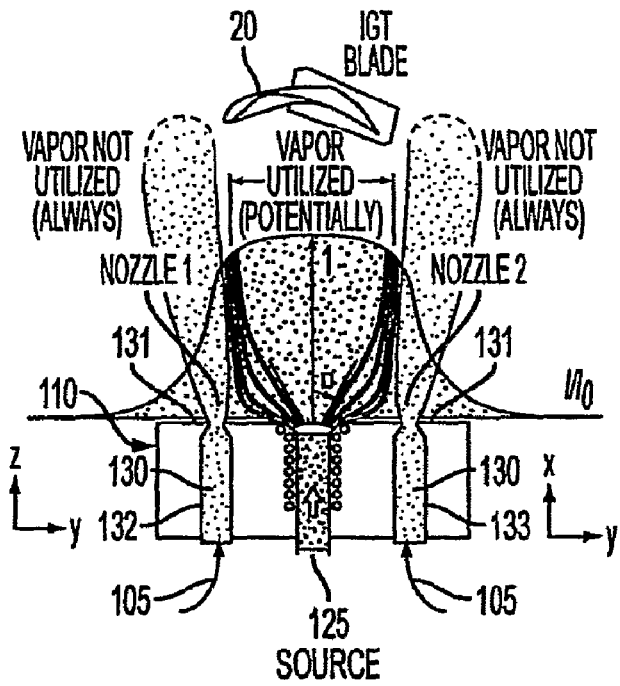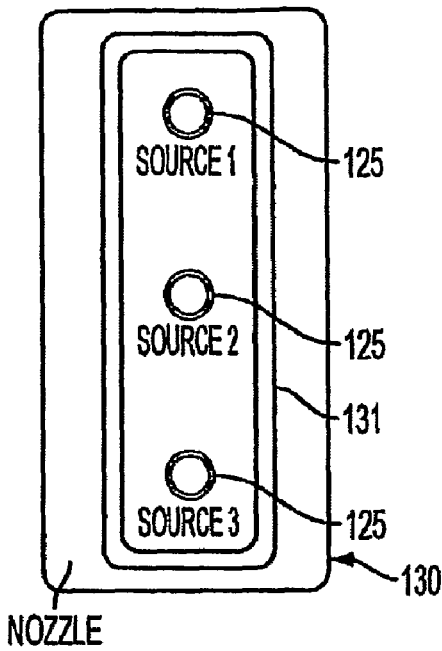
FIG. 8A
FIG. 8B
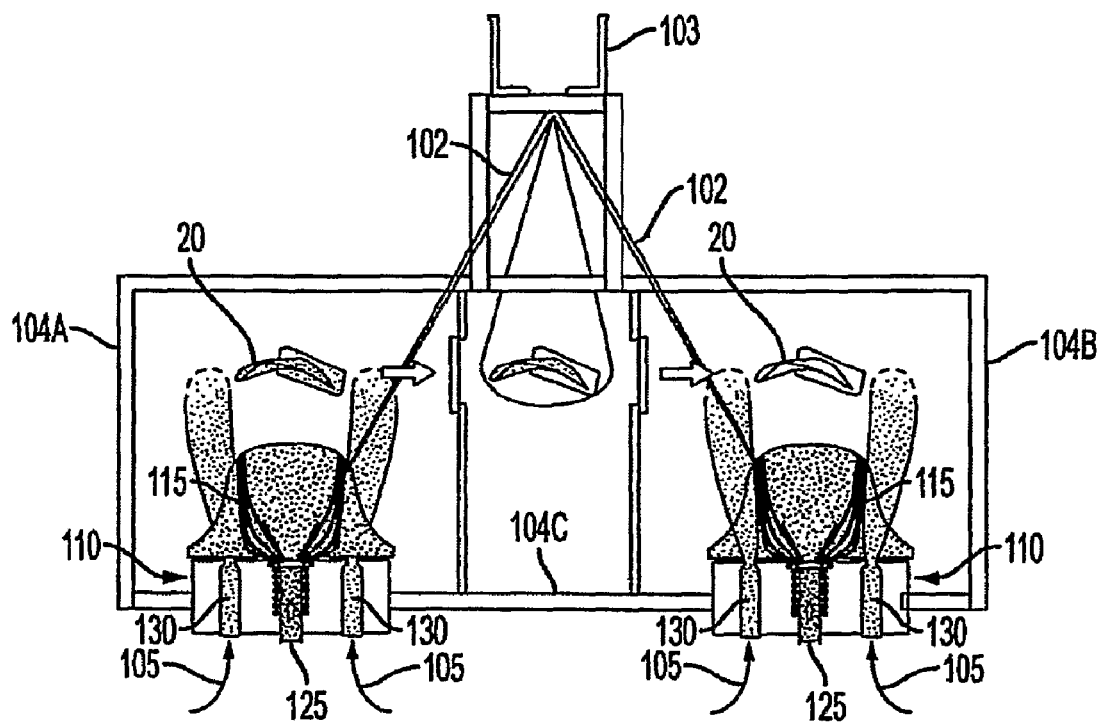
FIG. 9

RELIANT THERMAL BARRIER COATING SYSTEM AND RELATED METHODS AND APPARATUS OF MAKING THE SAME

CROSS-REFERENCES TO RELATED APPLICATIONS

The present application is a national stage filing of International Application No. PCT/US2006/025978, filed on Jun. 30, 2006, which claims priority from U.S. Provisional Patent Application Ser. No. 60/695,348, filed Jun. 30, 2005, entitled "Prime Reliant Thermal Barrier Coating Concepts and Methods of Making the Same," the entire disclosures of which are hereby incorporated by reference herein it their entirety.

BACKGROUND OF THE INVENTION

Thermal Barrier Coatings (TBCs) are used extensively in aircraft, marine and industrial gas turbine engines and in some diesel engines. They typically consist of a single metallic (or intermetallic) bond coat and a single ceramic top coat. The bond coat is made from a high aluminum content alloy such as NiAl modified with platinum and/or rare earth elements or a NiCoCrAlY alloy is used to provide oxidation and hot corrosion protection of the substrate (which is usually a nickel or cobalt based superalloy) and to promote the growth of an alpha aluminum oxide thermally grown oxide (TGO) which has high adhesion to the bond growth and provides a stable surface for the top coats deposition. The top coat typically consists of yttria stabilized zirconia (YSZ) (typically 7-8 wt. % yttria with the balance zirconia). It provides thermal insulation of the underlying metal. By insulating the metallic component, its temperature is reduced allowing it to last longer or to survive with less cooling air (cooling air reduces the performance of the engine). Spallation, foreign object damage, hot corrosion and glassy contaminants limit the average coating life and preclude the use of these coatings in prime reliant applications where failure of the coating would result in failure of the components it is applied to.

BRIEF SUMMARY OF INVENTION

An aspect of various embodiments of the present invention provides, but not limited thereto, (i) a new multilayer coating architecture that will have robust performance in the cyclically loaded environments of engines and the like and (ii) a new process for malting (as well as related apparatus for making) either existing single bond+top coat layer systems or multilayered systems in a single deposition sequence within a single coating apparatus. This processing approach is also able to, among other things, "condition" the bond coating(s) surface to achieve a desired surface topology and aluminum (or other) oxide phase and spatial distribution. An aspect of various embodiments of the present invention will enable the deposition of thermal barrier coatings (TBCs) with a controlled interface between the bond coat and the top coat and a novel coating structure consisting of a primary bond coat and top coat and at least one secondary bond coat and top coat to enable prime reliant requirements to be met. An aspect of an approach of various embodiments of the present can be implemented in a small coating system with low capital costs so that small volumes of parts can be deposited at low cost. The compositional and morphological flexibility of this approach also enables many other advanced multilayered functional coating to be more economically deposited (such as those for erosion or hot corrosion). It is envisioned that cost benefits will result from the reduction in the time (value added time and production flow time), man-power and equipment needed to create conventional single layered TBC coatings. Significant performance benefits are enabled by the various embodiments of the present invention multilayer TBC coating structures.

An aspect of an embodiment of the present provides a method for forming a thermal barrier coating system in communication with at least a portion of at least one substrate. The method may comprise: depositing a bond coat on at least a portion of at least one the substrate; depositing a thermal barrier coat disposed on the bond coat; and wherein the bond coat and the thermal barrier coat are deposited using at least one of a variety of deposition techniques. Such techniques may include, but not limited thereto, the following: directed vapor deposition (DVD), evaporation (thermal, RF, laser, or electron beam), reactive evaporation, sputtering (DC, RF, microwave and/or magnetron), reactive sputtering, electron beam physical vapor deposition (EF-PVD), ion plasma deposition (IPD), low pressure plasma spray (LPPS), high velocity oxy-fuel (HVOF), vapor deposition, cluster deposition, cathodic arc deposition, or jet vapor deposition, or any combination thereof.

An aspect of an embodiment of the present provides a method for forming a thermal barrier coating system in communication with at least a portion of at least one substrate. The method may comprise: depositing a bond coat on at least a portion of at least one the substrate; depositing a thermal barrier coat disposed on the bond coat; and wherein the bond coat and the thermal barrier coat are deposited using directed vapor deposition (DVD). Further, a more detailed description of the method further comprises: presenting the at least one substrate to a chamber, wherein the chamber has a down stream pressure, $P_c$, with an operating range from about 0.0001 Pa to about 150 Pa; presenting at least one evaporant source to the chamber for the bond coat; presenting at least one evaporant source to the chamber for the thermal barrier coat; presenting at least one carrier gas stream to the chamber, wherein the at least one carrier gas stream is generated from at least one nozzle; impinging at least one the evaporant bond coat source with at least one energetic beam in the chamber to generate an evaporated bond coat vapor flux in a main direction respective for any of the evaporant sources impinged by the energetic beam; impinging at least one evaporant thermal barrier coat source with at least one energetic beam in the chamber to generate an evaporated thermal barrier coat vapor flux in a main direction respective for any of the evaporant sources impinged by the energetic beam; the at least one carrier gas stream has a pressure ratio in the operating range from about 1.01 to about 10,000,000; the substrate having a temperature approximately equal to or greater than a melting point of the substrate; the at least one evaporant bond coat source and the at least one evaporant thermal barrier coat source generate the evaporated vapor flux and an evaporation rate in the range of about 0.00001 g/min to about 100,000 g/min; and deflecting at least one of the generated evaporated bond coat vapor flux and the generated evaporated thermal barrier coat vapor flux by at least one of the carrier gas stream, wherein the carrier gas stream is essentially parallel to the main direction and substantially surrounds the evaporated bond coat flux and the generated evaporated thermal barrier coat vapor flux, wherein the evaporated vapor bond coat flux at least partially coast the substrate to provide a bond coat and the generated evaporated thermal barrier coat vapor flux at least partially coats the bond coat to provide a thermal barrier coat.

An aspect of an embodiment of the present provides a method for forming a thermal barrier coating system in communication with at least a portion of at least one substrate. The method may comprise: depositing a first bond coat on at least a portion of at least one the substrate; depositing a first thermal barrier coat disposed on the bond coat; and wherein the bond coat and the thermal barrier coat are deposited without exposing the thermal barrier coating system to atmospheric conditions.

An aspect of an embodiment of the present provides a method for forming a thermal barrier coating system in communication with at least a portion of at least one substrate. The method may comprise: depositing a first bond coat on at least a portion of at least one the substrate; depositing a first thermal barrier coat disposed on the bond coat; and the deposition occurs in one or more chambers to form the thermal barrier coating system; wherein: the deposition of the deposition of the first bond coat and the deposition of the first thermal barrier coat is performed without out-of-chamber handling of the thermal barrier coating system. Further, the method may provide for non-line of sight coating (NLOS) (for example), wherein the down stream pressure, $P_c$, of the chamber has an operating may be in the range of range from about 1 Pa to about 133 Pa (other ranges and processing conditions/parameters are feasible as desired and required)

An aspect of an embodiment of the present provides an apparatus for forming thermal barrier coating system in communication with at least a portion of at least one substrate. The apparatus may comprise, but not limited thereto, the following:: a directed vapor deposition (DVD) apparatus, an evaporation (thermal, RF, laser, or electron beam) apparatus, a reactive evaporation apparatus, a sputtering (DC, RF, microwave and/or magnetron) apparatus, a reactive sputtering apparatus, an electron beam physical vapor deposition (EF-PVD) apparatus, an ion plasma deposition (IPD) apparatus, a low pressure plasma spray (LPPS) apparatus, a high velocity oxy-fuel (HVOF) apparatus, a vapor deposition apparatus, a cluster deposition apparatus, a cathodic arc deposition apparatus, or a jet vapor deposition apparatus, or any combination thereof. The apparatus for forming the thermal barrier coating system is adapted to: deposit a bond coat on at least a portion of at least one the substrate; and deposit a thermal barrier coat disposed on the bond coat.

An aspect of an embodiment of the present provides an apparatus for forming a thermal barrier coating system in communication with at least a portion of at least one substrate. The apparatus may comprise a directed vapor deposition (DVD) apparatus, wherein the apparatus for forming the thermal barrier coating system is adapted to: deposit a bond coat on at least a portion of at least one the substrate; and deposit a thermal barrier coat disposed on the bond coat An aspect of an embodiment of the present provides an apparatus for forming a thermal barrier coating system in communication with at least a portion of at least one substrate. The apparatus may be adapted to: deposit a first bond coat on at least a portion of at least one the substrate; deposit a first thermal barrier coat disposed on the bond coat; and wherein the apparatus being adapted whereby the bond coat and the thermal barrier coat are deposited without exposing the thermal barrier coating system to atmospheric conditions.

An aspect of an embodiment of the present provides an apparatus for forming a thermal barrier coating system in communication with at least a portion of at least one substrate. The apparatus may be adapted to: deposit a first bond coat on at least a portion of at least one the substrate; deposit a first thermal barrier coat disposed on the bond coat; and one or more chambers, wherein the apparatus being adapted whereby the deposition occurs in one or more chambers to form the thermal barrier coating system; wherein: the deposition of the first bond coat and the deposition of the first thermal barrier coat is performed without out-of-chamber handling of the thermal barrier coating system.

An aspect of an embodiment of the present provides a thermal barrier coating system in communication with at least a portion of at least one substrate. The coating system may comprise: a bond coat on at least a portion of at least one the substrate; a thermal barrier coat disposed on the bond coat; and a sealant layer on the deposited thermal barrier coat. Further, wherein the sealant layer may be a second bond coat layer.

BRIEF SUMMARY OF THE DRAWINGS

FIG. 8(A) is a schematic illustration of a side view of the crucible/gas jet nozzle configuration used for the high rate deposition of bond coat and top coat materials onto IGT parts.

FIG. 8(B) is a schematic illustration of the corresponding top view of the crucible/gas jet nozzle configuration of FIG. 8(A).

FIG. 9 is a schematic illustration showing a production coating concept that will enable the single-step deposition of a complete TBC system as well as advanced multilayered structures.

DETAILED DESCRIPTION OF THE INVENTION

Thermal Barrier Coatings

Figure 1:
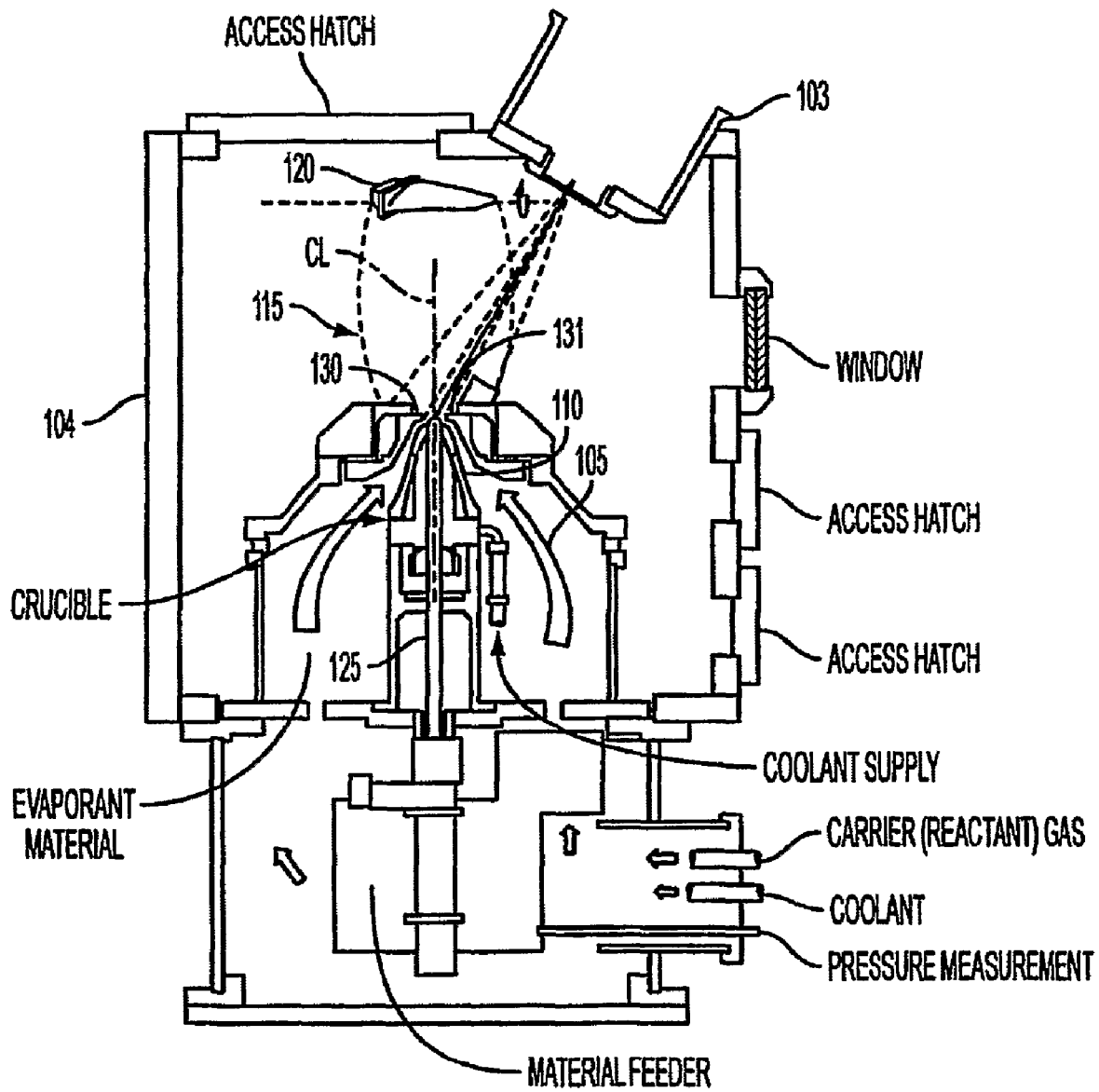
FIG. 1 is a schematic illustration of the energetic beam (e.g., e-beam) orientation in one configuration of a DVD processing system.

The performance (fuel efficiency and thrust) of gas turbine engines is greatly improved as engine operating temperatures are increased. Similar improvements are seen for diesel engines. As a result, the hot structural components of these engines are designed to operate at very high temperatures, often approaching their melting point. As gas inlet temperatures have continued to rise, failure by thermally-induced mechanisms have been avoided through the development of higher temperature alloys, and for gas turbine engines by the emergence of directionally solidified and single crystal turbine blades, and by designing airfoil components with internal cooling conduits to allow injected compressor discharge air to decrease the component temperature. The use of cooling air, however, reduces engine efficiency and thus, it is desirable to minimize the use of this air for cooling purposes. All these approaches have now matured and alternate strategies that exploit the insulating abilities of thermal barrier coatings (TBC's) are the most realistic near-term technology for thermally protecting engine components to enable higher gas inlet temperatures. TBC's have the potential to delay (or avoid completely) the costly (and difficult) development of higher temperature replacement materials for the nickel based superalloy components currently used in the hot sections of these engines.

As a result, TBC are now widely utilized in gas turbine engines. A TBC works by creating a thermally insulating layer between the hot engine gases and the air-cooled component. The resulting temperature drop across the coating (170° C. or greater is possible) "protects" the component surface by lowering the temperature that it is exposed to. A lack of durability in these systems, however, has limited engine designers to only use them primarily for component life extension. Experience with TBC's on aircraft engine turbine airfoils has shown that current TBC systems provide a component life improvement of at least 2× and that some modest reduction in component cooling airflow can be achieved. Both contribute to a performance gain for the engines that use them. As TBC technology has matured, increased emphasis is being placed upon the ultimate temperature benefit and durability that can be derived from these systems. Much greater engine performance benefit, up to several percent thrust improvement or specific fuel consumption reduction, is possible if the full potential of a lower thermal conductivity TBC system were realized. Such improvements can only be exploited if the coatings are so reliable that they can be guaranteed not to cause engine failure.

Today's TBC systems consist of a single bond coat, a single thermally grown oxide (TGO), and a single thermally insulating ceramic TBC (top coat). In most applications, the bond coat is either a MCrAlY (where M=Ni or NiCo) or a Pt modified aluminide coating. The bond coat (typically ~50 μm thick) is required to provide protection to the superalloy substrate from oxidation and hot corrosion attack and to form an adherent TGO on its surface. The TGO is formed by oxidation of the aluminum that is contained in the bond coat to form aluminum oxide. The TBC layer is currently 7 wt % yttria stabilized zirconia (7YSZ) with a typical thickness of 100-300 um. The EB-PVD process used to apply the TBC produces a columnar microstructure with several levels of porosity. The porosity between the columns is critical to providing strain tolerance (via a very low in-plane modulus) for the TBC, as it would otherwise spall on thermal cycling due to thermal expansion mismatch with the superalloy substrate. The finer porosity aids in reducing the thermal conductivity. The current life-limiting feature of TBCs is delamination of the ceramic topcoat. As the TGO thickness exceeds several microns, it cracks laterally and the topcoat is no longer attached, resulting in the failure of the TBC. In addition, if the TGO forms a non-planar interface with the ceramic topcoat (due often to bond coat rumpling), stresses within it intensify, leading to cracking at even thinner TGO thicknesses. The loss of aluminum from the bond coat during thermal exposure results in martensitic transformations in the bond coat that drives the rumpling phenomena. Other issues also exist for the development of more durable TBC systems. These include the anticipated higher temperature exposures of the top and bond coats, the unpredictable TBC loss at airfoil leading edges due to erosion and impact damage (i.e. foreign object damage or FOD) and failures related to the presence of calcium magnesium aluminosilicate (CMAS) in the engine.

In next generation TBC's, higher thermal gradients are envisioned through a "prime reliant" TBC that will drive the surface temperature of the top coat closer to the turbine inlet gas temperature. The inlet temperature is expected to continually rise and operating temperatures in these engines will be well above current levels where TBCs have demonstrated success. Bond coat temperatures will also rise as the next generation of superalloy is used at higher temperatures. Concurrently, longer lives at these temperatures will be desired for cost reduction. This will require advanced top coat materials and structures with better the high temperature phase and microstructural stability and advanced bond coats with improved oxidation properties and high temperature properties.

Currently, however, engine designers do not use TBC's in a prime reliant manner. As a result, the maximum performance benefits of the TBC are not taken advantage of. Instead TBC's are most typically used only to extend the lifetime of the turbine components. In order to use TBC's in a prime reliant manner the durability of the coatings must be improved and they must be able to survive any potentially damaging event the may occur during the life of an engine. In addition to failures related to stresses in the TGO, a "prime reliant" TBC system must also survive damage of the TBC by material ingested into the engine. This material can either thin the top coat or remove the entire top coat from local regions of the component. The result is higher local bond coat temperatures that can accelerate TGO failure mechanisms. Current designs require full cooling airflow in these impact damage prone areas. Erosion rates are related to the top coat materials and microstructural features, such as column density, diameter and orientation. Large column sizes or sintered together volumes of columns and off-normal columns result in the highest erosion rates. Exposure to CMAS at temperatures above its melting point (~1250° C.) can also sinter together columns and thus, detrimentally affect erosion rates. In extreme cases, high temperature sintering and CMAS exposure result in sufficient loss-of-compliance to delaminate the entire top coat. Although secondary issues for current TBC systems, as more durable, higher performance TBC's are developed these issues will become more important and therefore must be considered in the design of any next generation TBC system. If coating structures are developed that suppress or control these damage mechanisms engines temperatures could be reliably increased and large increases in the engine performance could be achieved.

The conventional two layer TBC system structure has been successful in extending the life of the underlying component have not enabled the coatings to be used in a prime reliant manner and may never achieve that goal. However, while the convention system architecture is a solution within the processing constraints; we contend it is not the "ideal" TBC system structure. Instead we view it as the "best" TBC structure that is easy to make with conventional deployed process technologies.

Accordingly, through the development of advanced TBC manufacturing approaches provided by the present invention more advanced multilayered TBC concepts have been conceived here which shall greatly improve coating performance. These coating structures and methods for applying such coating structures are described below.

Advanced Coating Structures Enabled Using Multilayered TBC Designs

Referring to FIG. 1, FIG. 1 is a schematic illustration of the energetic beam (e.g., e-beam) orientation in a configuration of an embodiment of the present invention DVD processing system. In an embodiment, the carrier gas 105 flows completely or substantially around the crucible 110 so that the vapor flux 115 can be focused onto the substrate 120 located directly above the evaporant source(s) 125. The carrier gas 105 may be adapted to flow substantially parallel with the normal axis, identified as CL, or other direction(s) as desired. Additionally, as will be discussed later herein, the nozzle 130 has a nozzle hole or opening 131, through which the carrier gas 105 flows, and may be designed such that a more optimal carrier gas speed distribution for focusing the vapor 115 is produced. Also shown is the electron energetic beam 103 (e.g., beam gun) and vacuum chamber 104.

Figure 2:
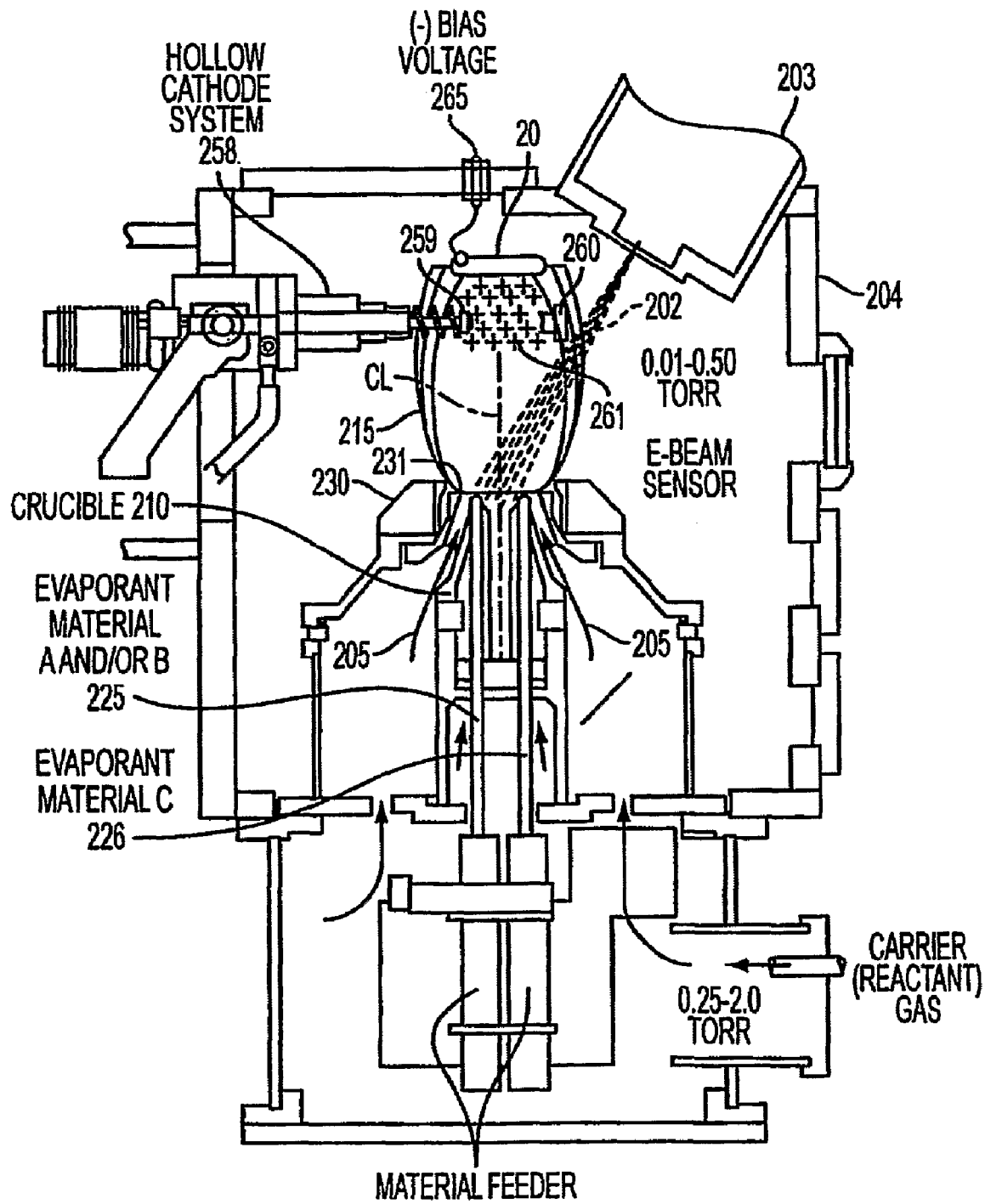
FIG. 2 is a schematic illustration of the directed vapor deposition (DVD) apparatus.

Referring to FIG. 2, FIG. 2 is a schematic illustration of the directed vapor deposition (DVD) process. In the DVD, the carrier gas stream 205 is created by a rarefied, inert gas supersonic expansion through a nozzle 230. The speed and flux of the atoms entering the chamber 204, the nozzle parameters, and the operating chamber pressure can all be varied leading to a wide range of accessible processing conditions. As part of the process the supersonic carrier gas stream may be maintained by achieving a high upstream pressure (i.e. the gas pressure prior to its entrance into the processing chamber), $P_u$, and a lower chamber pressure, $P_o$. The ratio of the upstream to downstream pressure along with the size and shape of the nozzle opening 231 controls the speed of the gas entering the chamber 204. The carrier gas molecular weight (compared to that of the vapor) and the carrier gas speed controls its effectiveness in redirecting the vapor atoms via binary collisions towards the substrate 20. As will be discussed later, alternative embodiments of the present invention process will provide other capabilities to evaporate from one, two or more individual source rods and the ability to ionize the evaporated flux using hollow cathode plasma activation.

Still referring to FIG. 2, the aforementioned DVD process as schematically shown in FIG. 2, improves the deposition efficiency, increases the deposition rate, optionally provides coating dispersoids, and enhances the coating uniformity, as well as other aspects as discussed throughout this document. As will be discussed later, the hollow cathode system 258 is optional based on desired operations. In an embodiment, the carrier gas 205 is realigned so that it is substantially in-line with the crucible 210. In this alignment, the carrier gas flow is placed completely or substantially around the crucible 210 so that the vapor flux 215 no longer has to be turned 90 degrees towards the substrate 20, but rather can be simply focused onto the substrate located directly above the evaporant source 225 for material A and/or B and/or evaporant source 226 for material C. For example, material A, B and/or C may include Zirconium, Hafnium, mullite, alumina, silica, any oxide ceramic, ceria, zirconate, garnet, lanthanum aluminate, titania, any carbide, silicide or combination thereof, as well as other ceramic materials or combinations thereof. It should be appreciated that as discussed throughout this document, materials A, B and/or C may have substantially the same chemical composition relative to one another; or alternatively may have different chemical compositions relative to one another.

Further, it should be appreciated that as discussed throughout this document, the size or area of the evaporant source may vary as desired or required. Exemplary ranges may include, but not limited thereto, the evaporant source having a diameter in the range of about 0.1 inch to about 10 inch or about 0.5 inch to about 1 inch. Again, the size and area may be larger or smaller. For example, exemplary surface areas may include ranges from about 0.007 to about 80 square inches or about 0.19 to about 0.8 square inches. The evaporant surface areas may be larger or smaller depending on the coating/deposition process requirements.

The carrier gas 205 flows substantially parallel with the normal axis, identified as CL. Additionally, as will be discussed later herein, the nozzle 230 has a nozzle gap or opening 232, through which carrier gas 205 flows, is designed such that a more optimal carrier gas speed distribution for focusing the vapor 215 is produced. Also shown is the energetic beam source 203 (as discussed throughout this document), which should be appreciated to take a variety of forms as such as, but not limited thereto, electron beam source, laser source, heat source, ion bombardment source, highly focused incoherent light source, microwave, radio frequency, EMF, or combination thereof, or any energetic beams that break chemical bonds.

Figure 3:
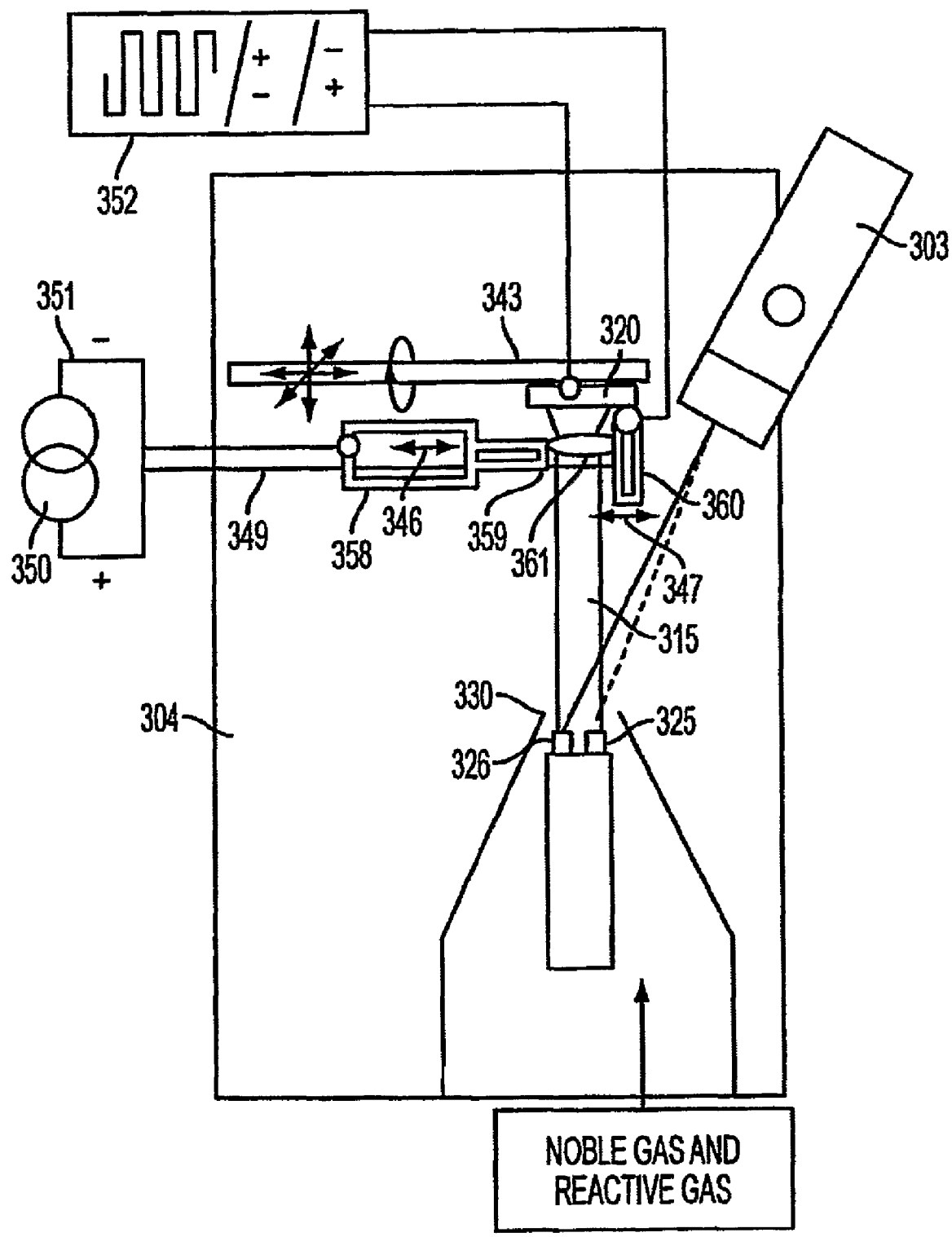
FIG. 3 is a schematic illustration of directed vapor deposition (DVD) apparatus including a hollow cathode arc plasma activation and substrate bias.

Turning to FIG. 3, the major components of the present invention DVD apparatus including a hollow cathode arc plasma activation and substrate bias supply as schematically shown. The present invention DVD system embodiment comprises a vacuum chamber 304, a first rod feed evaporator 325 (evaporant A &/or B) and/or second rod evaporator 326 (evaporant C) that are placed and heated up to evaporation temperature of evaporant by the electron-beam of an electron gun 303 and provides the vapor for coating of substrates 320. Vaporized evaporant is entrained in the supersonic gas and vapor stream 315 formed by the nozzle 330. The substrate(s) 320 are fixed at a substrate holder 343 which enables shift (or any desired/required movement) of the substrate 20 in any independent direction and to be swiveled. For example, the translation motion in the horizontal plan allows the exposed surface areas of the substrate to the vapor stream for defined dwelling times and control of the local coating thickness. The vertical motion can be used to keep constant the distance between plasma and surface for curved substrates. Swivel motion, in coordination with the translation motions, can be used to enable the coating of complete three-dimensional parts or can be used also to change the incidence angle of the vapor particles in the course of layer coating in a defined way for getting distinct layer properties. The hollow cathode (arc source) 358 is placed laterally below substrate holder 343 with a short distance between the cathode orifice 359 and the gas and vapor stream 315. The anode 360 is arranged opposite the cathode orifice 359 (i.e., on an approximate distant side of the stream 315) so that the fast electrons and the plasma discharge 361 crosses the gas and vapor stream 315. The fixtures for the cathode 346 and for the anode 347 provide the ability to adjust the distance of the cathode 358 and the anode 360, thereby influencing the diameter and the shape of gas and vapor stream 315.

The plasma discharge 361 is in close proximity (arranged with short distance) to the surface of the substrate 320 enabling close contact between dense plasma and the substrate surface to be coated. In the vicinity of the evaporation electron-beam from the electron gun 303, the anode power line 349 from the power generator 350 to the anode 360 is arranged closely and in parallel with both the plasma discharge 359 and the cathode power line 351, which runs from the cathode to the power generator 350. Between the substrate 320 and the anode 360, a bias generator 352 is applied that allows for generation of a positive, a negative or a periodically alternating voltage between the substrate 320 and the plasma 361.

In all such cases, the ability to deposit compositionally controlled coatings efficiently, uniformly, at a high rate, with high part throughput, and in a cost-effective manner, among other things, is desired. According to the design criteria discussed throughout, some illustrative examples of deposition systems and methods (and resultant thermal barrier composition system structures) that may be implemented with some embodiments of the present invention are provided in the following applications and patents and are assigned to the present assignee and are all incorporated by reference herein in their entirety:

1) U.S. Pat. No. 5,534,314, filed Aug. 31, 1994, entitled "Directed Vapor Deposition of Electron Beam Evaporant,"

2) U.S. Pat. No. 5,736,073, filed Jul. 8, 1996, entitled "Production of Nanometer Particles by Directed Vapor Deposition of Electron Beam Evaporant,"

3) U.S. patent application Ser. No. 09/634,457 and corresponding U.S. Pat. No. 6,478,931 B1, filed Aug. 7, 2000, entitled "Apparatus and Method for Intra-layer Modulation of the Material Deposition and Assist Beam and the Multilayer Structure Produced There from,"

4) International Application No. PCT/US01/16693, filed May 23, 2001 entitled "A Process and Apparatus for Plasma Activated Deposition in a Vacuum," and corresponding U.S. Pat. No. 7,014,889, 5) International Application No. PCT/US02/13639, filed Apr. 30, 2002, and corresponding U.S. application Ser. No. 10/476,309, filed Oct. 29, 2003 entitled "Method and Apparatus for Efficient Application of Substrate Coating,"

6) International Application No. PCT/US2003/037485, filed Nov. 21, 2003 entitled "Bond Coat for a Thermal Barrier Coating System and Related Method thereof," and corresponding U.S. application Ser. No. 10/535,364, filed May 18, 2005, 7) International Application No. PCT/US2003/036035, filed Nov. 12, 2003, entitled "Extremely Strain Tolerant Thermal Protection Coating and Related Method and Apparatus thereof," and corresponding U.S. application Ser. No. 10/533,993, filed May 5, 2005, 8) International Application No. PCT/US2003/012920, filed Apr. 25, 2003, entitled "Apparatus and Method for High Rate Uniform Coating, Including Non-line of Sight," and corresponding U.S. application Ser. No. 10/512,161, filed on Oct. 15, 2004, 9) International Application No. PCT/US2003/023111, filed Jul. 24, 2003, entitled "Method and Apparatus for Dispersion Strengthened Bond Coats for Thermal Barrier Coatings," and corresponding U.S. application Ser. No. 10/522,076, filed on Jan. 21, 2005, 10) International Application No. PCT/US02/28654, filed Sep. 10, 2002 entitled "Method and Apparatus for Application of Metallic Alloy Coatings" and corresponding U.S. application Ser. No. 10/489,090, filed Mar. 9, 2004, 11) International Application No. PCT/US2004/024232, filed Jul. 28, 2004 entitled "Method for Application of a Thermal Barrier Coating and Resultant Structure thereof" and corresponding U.S. application Ser. No. 10/566,316, filed Jan. 27, 2006, 12) International Application No. PCT/US2005/000606 filed Jan. 10, 2005, and corresponding U.S. Application filed Jun. 28, 2006, and 13) International Application No. PCT/US99/13450 filed Jun. 15, 1999 entitled "Apparatus and Method for Producing Thermal Barrier Coatings" all of these patents and applications are hereby incorporated by reference herein in their entirety.

According to the design criteria discussed throughout, various substrate designs (walls, components, regions, structures, longitudinal sections) of the present invention are possible. For example, as shown in co-pending and co-assigned PCT International Application No. PCT/US02/17942, entitled "Multifunctional Periodic Cellular Solids And The Method Of Making the Same," filed on Jun. 6, 2002, and corresponding U.S. application Ser. No. 10/479,833, filed Dec. 5, 2003, which is hereby incorporated by reference herein in its entirety, there is provided ways of forming the substrate as a core that is comprised of three-dimensional space filling layers having an array of out-of-plane truss units. The out-of-plane truss units may be a variety of shapes including tetrahedral, pyramidal, Kagome, combinations thereof and other non-limiting arrangements. The out-of-plane truss units have hollow or solid leg members, for example, but not limited thereto. The core may be affixed to face plates.

According to the design criteria discussed throughout, other substrate designs (walls, components, regions, structures, longitudinal sections) of the present invention are possible. As shown in co-pending and co-assigned PCT International Application No. PCT/US01/17363, entitled "Multifunctional Periodic Cellular Solids And The Method Of Making Thereof," filed on May 29, 2001, and corresponding U.S. application Ser. No. 10/296,728, filed Nov. 25, 2002, which are hereby incorporated by reference herein in their entirety, there is provided ways of forming the substrate that includes a core that is comprised of textile layers with a center sheet disposed between adjacent said textile layers, however, alternatively, the center sheet may be omitted. In addition to woven textile arrays, various suitable materials may be used. For example, some non-limiting examples are the following: woven, knitted, braided, triaxial, and biaxial, pre-crimped quasi-triaxial, 3-D braid textile, 3-D multi-ply weave, 3-D triaxial weave, 3-D multi-axial weave, 3-D 'H' or 'I' beam, 3-D honey-comb type configurations, respectively, that can be used in arrays. Finally, other textile type classifications may be implemented as discussed and as shown in PCT No. PCT/US01/17363 and corresponding U.S. application Ser. No. 10/296,728.

In addition, according to the design criteria discussed throughout, other substrate designs (walls, components, regions, structures, longitudinal sections) of the present invention are possible. As shown in co-pending and co-assigned PCT International Application No. PCT/US01/22266, entitled "Heat Exchange Foam," filed on Jul. 16, 2001, and corresponding U.S. application Ser. No. 10/333,004, filed Jan. 14, 2003, which are hereby incorporated by reference herein in their entirety, there is provided other ways of forming the substrate coatings that includes a core that is comprised of an open cell having solid or hollow ligaments, foam, and/or interconnected network. Similarly, International Application No. PCT/US01/25158, entitled "Multifunctional Battery and Method of Making the Same," filed Aug. 10, 2001 and corresponding U.S. application Ser. No. 10/110,368, filed Jul. 22, 2002 is included as well.

Some exemplary, non-limiting, characteristics of the above-referenced applications, publications and patents that which the present application may implement include, but not limited thereto, the following: processing conditions and types (temperatures, pressures, gas and air flow, plasma systems, chamber size and number, deposition systems, etc); evaporant source conditions and types (including type, material, location, movement, number, size, etc.); and substrate conditions and types (including type, material, location, movement, number, size, etc.)

Controlled TBC/Bond Coat Interface

A critical manufacturing issue for TBC processing is the wide range in TBC lifetimes that are observed for coating systems consisting of the same TBC materials when different processing scenarios are employed. One example is the 10× lifetime improvement for EB-PVD deposited top layers compared to those of APS. Another is displayed in the work of Gell where different bond coat surface conditions were studied. In this case, grit blasted bond coats (which is a common manufacturing treatment prior to top coat deposition) were found to have a tight lifetime distribution while un-grit blast samples had a much wider lifetime distribution and some greatly extended lifetimes (3× longer than the grit blast case). It is believed that grit blasting of the bond coat surface introduces contaminates that result in an increased TGO growth rate and adversely affects the spallation resistance of the TGO. The rough surface created by grit blasting is, however, also believed to promote the formation of the desired alpha alumina phase and limit the formation of detrimental transient oxides. These transient oxides or other surface features of the "as-deposited" bond coat (such as those which may affect the microstructure of the TBC top coat) are believed to result in the occasional occurrence of short lives. The "infant" failures are clearly unacceptable in production use leading to the practice of grit blasting for the tighter lifetime distribution (at the cost of lower lives). However, this work illustrates that advanced manufacture processes that can produce more optimal interfaces between the bond coat and top coat may greatly improve TBC lifetimes in a reliable way.

DVD has the ability to manipulate the as-deposited interface between the bond coat and top coat by altering DVD process conditions, the use of plasma activation during the bond coat deposition and the use of pulsed e-beam treatments of the bond coat surface in-between the bond coat and top coat deposition. The properties of the interface between the bond coat and the top coat plays an important role in determining the lifetime of the TBC system. Although this still a subject of some debate, it is clear that the surface roughness, impurity level and defect density all affect the quality of the TGO scale that forms between these layers. We submit that in-situ control of the interfacial properties by altering the bond coat deposition conditions and/or by incorporating a pulsed, high energy e-beam treatment will enable an ideal interface that yields both long lives and a tight lifetime distribution.

Experimental and modeling studies have demonstrated that the surface roughness of the coating after vapor deposition is a function of the substrate temperature and kinetic energy of the deposited vapor atoms. These features can be controlled in the DVD approach by using substrate heating to alter thermal activation and through the use of plasma activation and substrate biasing to control the adatom kinetic energy. The effect of substrate heating was shown by Zu (See Z. Yu, D. D. Hass and H. N. G. Wadley, *Materials Science and Engineering A*, Volume 394, Issues 1-2, 15 Mar. 2005, Pages 43-52, of which is hereby incorporated by reference herein in its entirety) where the altering of the substrate temperature was found to alter the grain size and surface roughness of nickel aluminide coatings deposited using DVD. In this case, the surface roughness was in the form of terraces with the number of terrace per unit distance decreasing with an increased substrate temperature.

The use of advanced electron beam treating techniques will also alter the interface. These approaches result in the remelting and rapid solidification of very thin layers of a coating surface (10-100 μm). The post deposition treatment requires a special pulsed EB source with high current density, produced and released over short time. The resulting coating structure is well suited for slow, adherent oxide growth. This is presumably due to the advantageous properties which arise from the flash-like remelting of the alloy such as the production of surfaces with remarkably reduced roughness, fewer crack sources and the reduced content of impurities and segregations (i.e. the flash re-melting effect). This approach also has the advantage of being easily incorporated into the single-step production coating sequence.

Sealing Layers

The deposition of TBC's with their coefficient of thermal expansion (CTE) controlled sealing layers can be used to improve the resistance of the TBC to calcium magnesium aluminosilicate (CMAS) and salt destabilization. CMAS infiltration can lead to sintering induced failures and will become more of an issue in the future as the elevated temperatures of next generation coating systems are more readily imployed. The sintering together of columnar grains results in a loss of strain tolerance in the top coat that results in premature failures. The ingestion of CMAS (calcium magnesium aluminosilicate) into the engine can result in similar effects. CMAS is a common dirt that is ingested into turbines and deposits onto airfoil surfaces. In the turbine section, CMAS can form a molten glass at temperatures above about 1250° C. The CMAS wets 7YSZ and infiltrates the porous microstructure. Away from the coating surface the CMAS solidifies resulting in a loss of strain tolerance of the top coat. As surface temperatures increase, the depth and severity of CMAS penetration into 7YSZ is expected to increase. Vanadium based salts can also damage top coats due to their ability to de-stabilize the 7YSZ composition. Methodologies that prevent these issues will benefit the development of prime reliant TBCs.

Figure 4A:
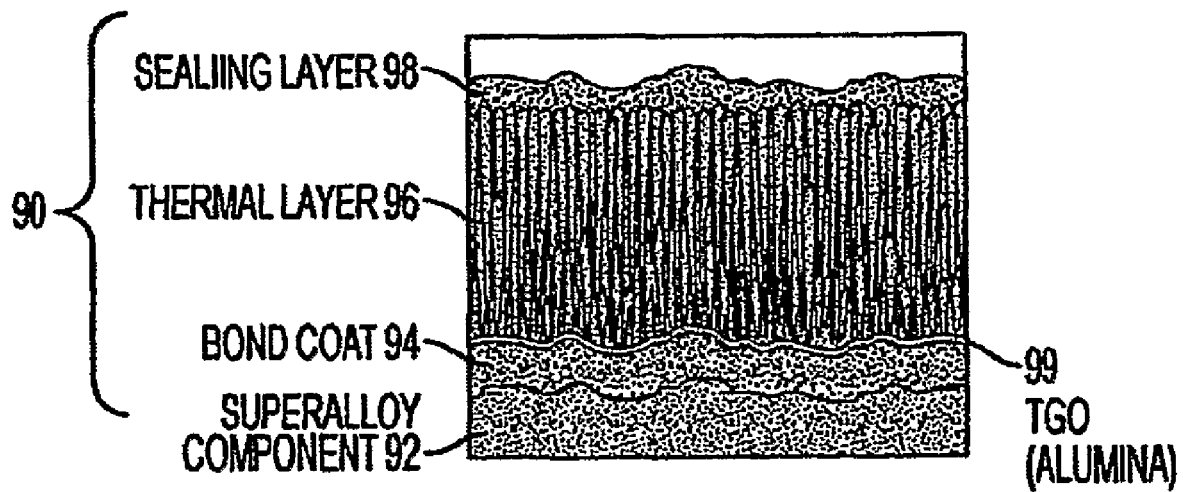
FIG. 4(A) illustrates a TBC system structure deposited onto a porous YSZ substrate.
Figure 4B:
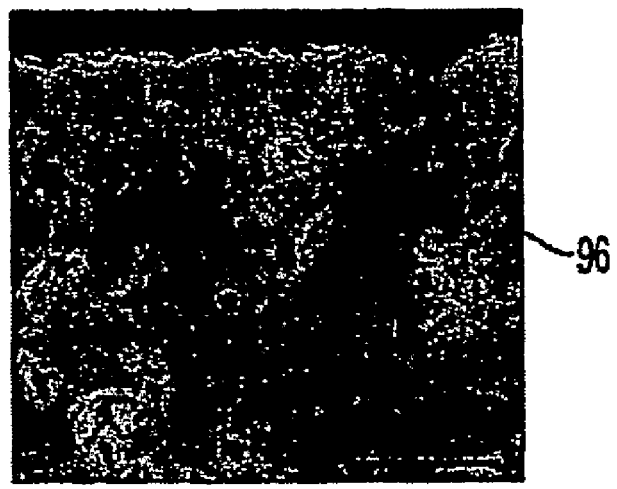
FIG. 4(B) represents a micrographic depiction of a partial enlarged view of FIG. 4(A) of the thermal barrier coat layer of a dense YSZ layer deposited onto a porous YSZ substrate using plasma activation.

CMAS and molten salt protection can be obtained by employing a dense, relatively high CTE layer as shown in FIG. 4(A). The high CTE ($>10\times10^{-6}$) of several oxides (notably $CeO_2$, $La_2O_5$, $Nd_2O_3$) make them candidate materials for this purpose. The dense layer would prevent CMAS infiltration into the TBC and the high CTE (when coupled with the high temperature gradient across the TBC) allows a good thermal expansion match with the superalloy substrate to prevent cracking. The precise position of this layer (with respect to the substrate) would depend upon the actual temperature gradient in the coating and the CTE's of the materials involved. An additional top layer may still be employed over the sealing layer to prevent erosion, provide an additional thermal benefit and tailor the temperature exposure of the sealing layer to match its CTE. It should be appreciated that the composition of the layers and substrate material may be a variety of required or desired compositions and materials as disclosed throughout the associated teachings of the various embodiments of the present invention. The advent of new metallic alloys with good ductility, and very low oxidation rates at high temperatures and very high melting points also make metal layers possible as the sealing layer. Especially if they are protected by a secondary thermal barrier (see below). As shown in FIG. 4(A), a dense YSZ layer is deposited onto a porous YSZ substrate using plasma activation. In accordance with the various embodiments of the present invention, FIG. 4(A) provides a schematic illustration of a TBC system structure 90 disposed on a substrate 92 having a bond coat 94 and thermal barrier coat layer 96, with a thermally grown oxide (TGO) layer 99 there between, as well as an optional a sealing layer 98. FIG. 4(B) represents a micrographic depiction of a partial enlarged view of the thermal barrier coat layer 96 of FIG. 4(A).

DVD has demonstrated the ability to deposit dense sealing layers of a given material onto porous, columnar coatings. The concern is the incorporation of porosity from the columnar layer into the sealing layer, however, DVD's unique processing environment that enables non line-of-sight coating onto the column sides and plasma activation has demonstrated success in depositing dense YSZ electrolytes on porous YSZ substrates in fuel cell applications. Similar success for this application is anticipated for TBC applications. The use of EB-treatments to re-melt the sealing layer after deposition further increased the probability of success.

Multi-Layered TBC Coatings

Figure 5:
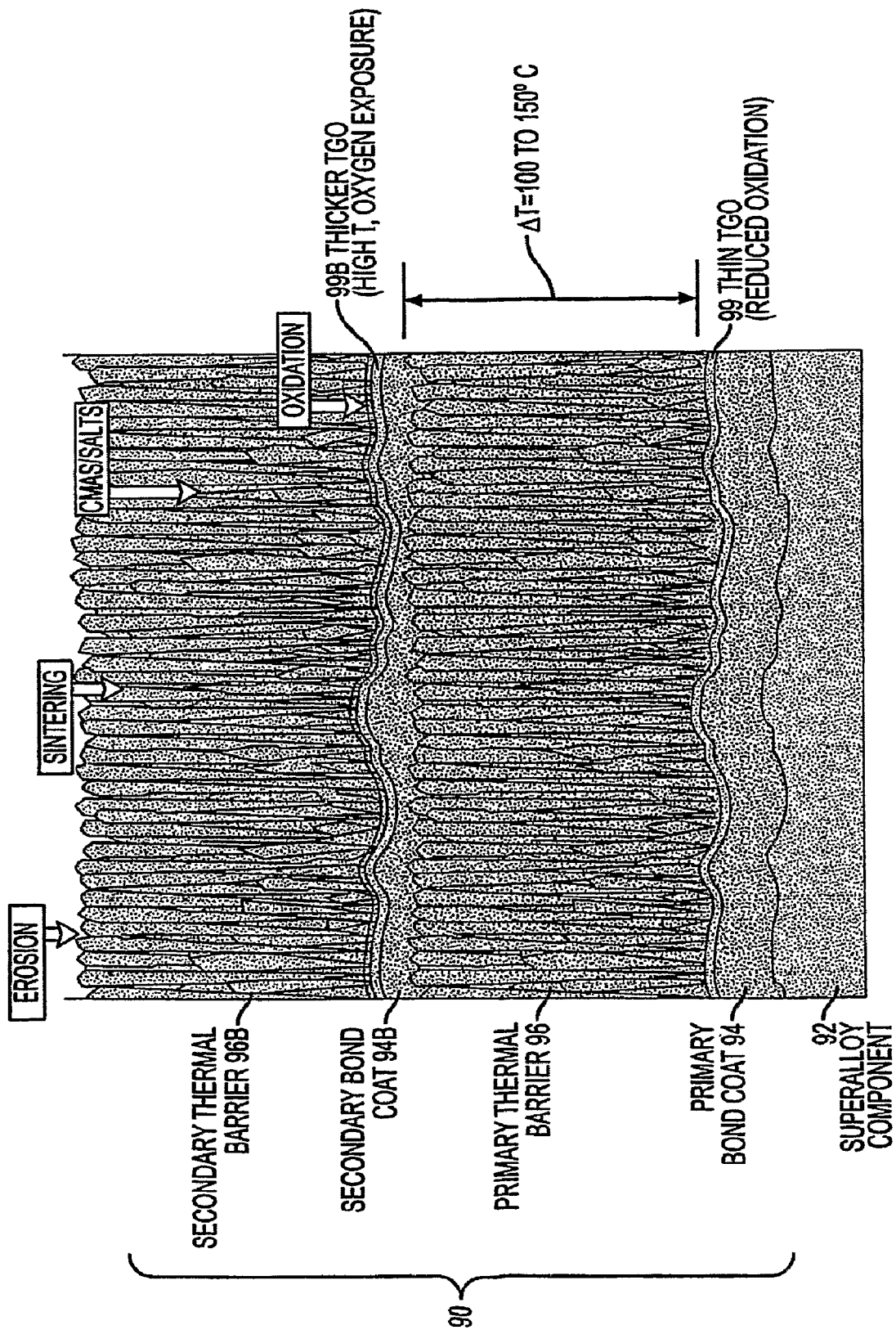
FIG. 5 is a schematic illustration of the $TB^2C$ structure. This concept (enabled by DVD technology) enables prime reliant or very long lived TBCs by removing the processes which cause failure away from the primary TBC layer. The result is a more graceful and easily detectable failure of the TBC that will promote the use of these layers as prime reliant coatings.

It has been demonstrated that dense layers of a material can be deposited over a porous substrate. This is enabled with high substrate temperatures, NLOS coating, plasma activation or the use of the e-beam treatments. This ability sets up the capability of depositing a secondary bond coat above the initial TBC. This material would need to be a bond coat material with excellent elevated temperature oxidation resistance since it would be on the hot side of the TBC and have a similar CTE as the substrate (ideally slightly lower due to the $\Delta T$ across the TBC), leaving it relatively unstressed at temperature. The secondary thermal barrier could then be applied to provide thermal protection for the secondary bond coat. The secondary bond coat and thermal barrier would protect the primary TBC resulting in the possibility of depending on the primary TBC as a prime reliant coating. The resulting structure is given in FIG. 5. In accordance with the various embodiments of the present invention, FIG. 5 provides a schematic illustration of a TBC system structure 90 disposed on a substrate 92 having a bond coat 94 (primary) and thermal barrier coat layer 96 (primary), with a thermally grown oxide layer (TGO) there between, as well as an optional a sealing layer that may comprise 94B (secondary) and thermal barrier coat layer 96B (secondary), with another thermally grown oxide (TGO) 99B layer there between. It should be appreciated that the composition of the layers and substrate material may be a variety of required or desired compositions and materials as disclosed throughout the associated teachings of the various embodiments of the present invention.

In an embodiment, this multilayered TBC structure (i.e. a TBC with two thermal barrier layers) would function as follows. The primary bond coat and thermal barrier layer would function as a prime reliant TBC. Thus, the engine operating temperature could be increased by a given temperature. The secondary bond coat and thermal barrier layer would protect the primary layers from the combustion environment by absorbing the exposure of the primary layers. This secondary coat will limit oxygen transport to the primary bond coat and prevent erosion, molten salt infiltration, vertical cracks from FOD and sintering in the primary thermal barrier. Ideally, the secondary layer will always fail prior to the primary layer, since it is exposed to higher temperatures, oxidation, corrodants and erosion. The failure of the secondary thermal barrier layer will be visually observable during inspection (or with in-situ devices such as IR cameras). Provided the prime reliant coating had a minimum life greater than the time between visual inspections (or on-line inspections), the coating could be used as a prime reliant layer for the life of the secondary layer. The failure of the secondary layer would signal the end of the time period where the primary layer could safely be used as a prime reliant coating. Since TBCs will typically fail at the bond coat/TGO or TGO/thermal barrier interfaces, the failure of the secondary thermal barrier would not necessarily result in the spallation of the secondary bond coat and thus this layer would still provide protection for some period. The addition of advanced materials in the primary and secondary layers as well as the optimization of the bond coat/top coat interface will also extend the useful life of the prime reliant coating. In situations where prime reliance is not required these concepts would greatly improve the current TBC lifetimes.

Figure 6:
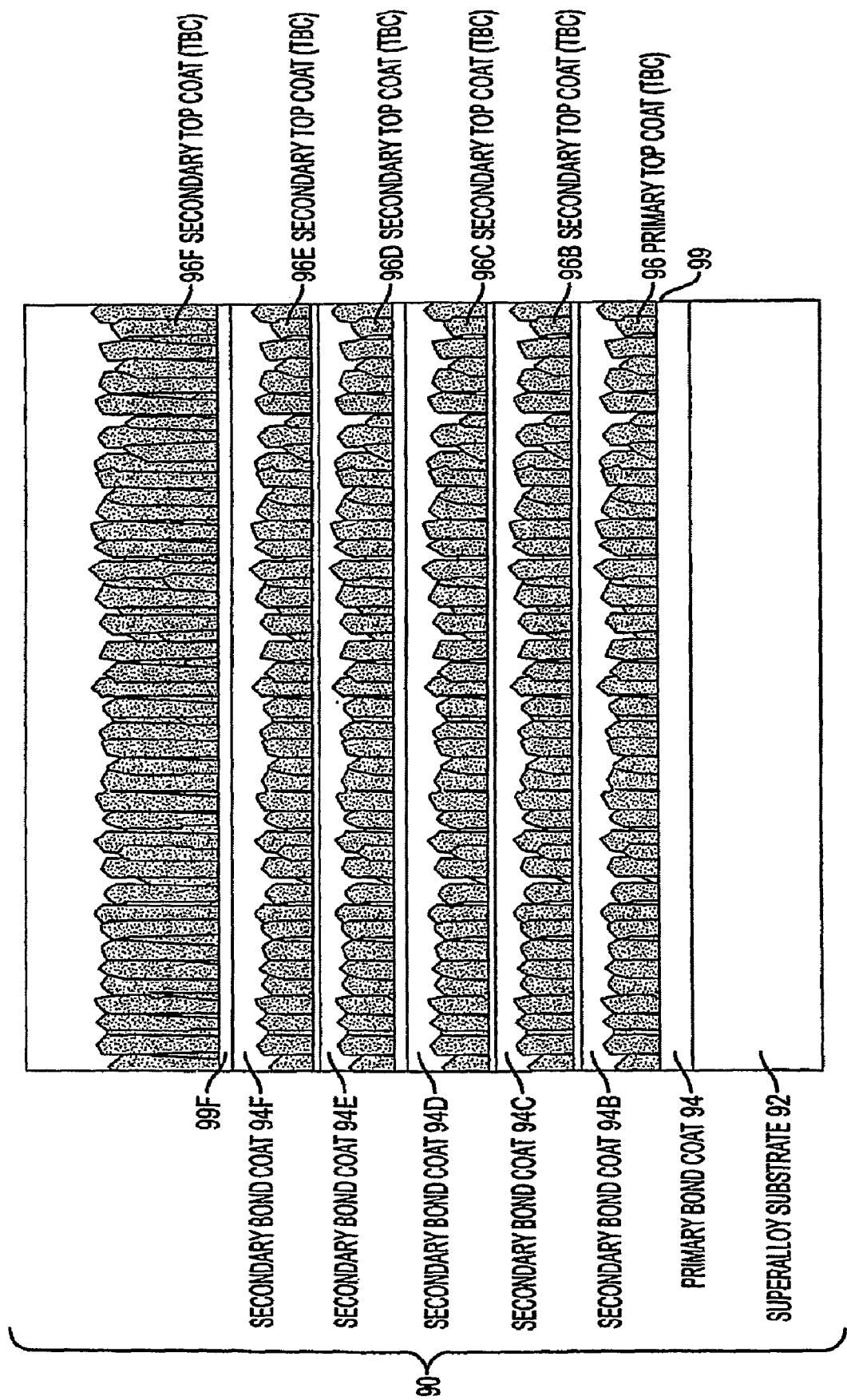
FIG. 6 is a schematic illustration of a multi-layered thermal barrier coating having a primary bond coat and top coat and multiple secondary bond coats and top coats.

More complex structures having numerous bond coats and top coats can also be set forth herein, as illustrated in FIG. 6, for example, but not limited thereto. These multi-layered coatings have additional advantages such as, but not limited thereto, the creation of extra interfaces that introduce interfacial thermal resistance and the mechanical and thermochemical decoupling if the bond layers from the substrate. Both the top coat and the bond coats would be thinner (as low as about 2 microns to about 5 microns, but not limited thereto) making it easier to create very dense and flat bond coat layers (non-planar bond coats can also be used to deposited brick-like structures to limit lateral crack propagation). Other exemplary coat thickness may be, but not limited thereto, about 2 microns to about 100 microns or about 0.5 microns to about 5,000 microns. It should be appreciated that the composition of the layers and substrate material may be a variety of required or desired compositions and materials as disclosed throughout the associated teachings of the various embodiments of the present invention. Coatings could consist of a minimum of two layers (i.e. a single bond coat and top coat) up to an arbitrary number of different layers. FIG. 6 schematically illustrates a multi-layered thermal barrier coating having a primary bond coat and top coat and multiple secondary bond coats and top coats. For instance, an exemplary embodiment may comprise TBC system structure 90 disposed on a substrate 92 having a bond coat 94 (primary) and thermal barrier coat layer 96 (primary), with a thermally grown oxide layer (TGO) 99 there between, as well as a multiple layers (one or more according to any desired or required number of multiple layers) 94B-F and thermal barrier coat layer (one or more according to any desired or required number of multiple layers) 96B-F. Further, it should be appreciated that the multiple layers may include thermally grown oxide (TGO) layers 96B-F, respectively.

These structures can be created using the single step TBC processing set-up shown in FIGS. 1-3 and 8-10 (as discussed herein). This concept would make the deposition of additional bond coats and thermal barriers trivial. For example, multiple bond and top coats could be deposited onto a component by moving the component back and forth from the top coat deposition chamber to the bond coat deposition chamber as the component would simply be coated with a similar cycle multiple times. When using the single chamber approach only the e-beam scanning pattern need to altered to create multiple bond coats and top coats. The high rates envisioned in this coater limit additional cost as these structures could be created with a similar coating time as current TBCs.

Figure 7:
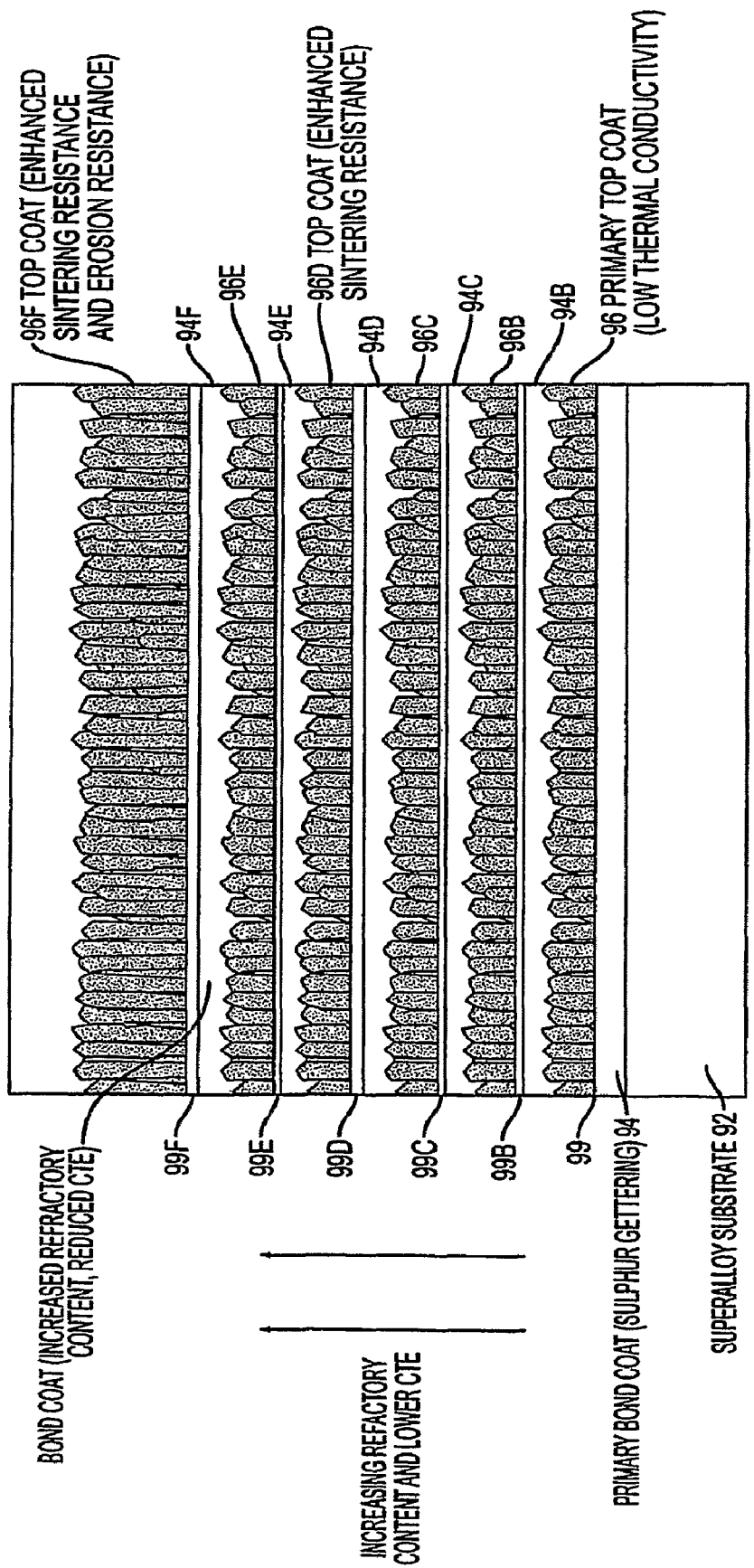
FIG. 7 is a schematic illustration of a multilayered TBC coating having a primary bond coat and top coat and multiple secondary bond coats and top coats. Each of the bond coats and top coats has a different composition to give the coating improved properties. The compositions (and substrate material) may be a variety of required or desired compositions (and substrate material) and should not be limited to the exemplary compositions (and substrate material) as illustrated.

Next, another aspect of various embodiments of the present invention provides that coating structures can be made from any TBC material (e.g., a PtAl bondcoat and 7YSZ topcoat or other top and bond coats as desired or required). The secondary bond and top coats may be the same composition as the primary layers or but can also be altered to functionally grade the properties of the TBC, as shown in FIG. 7. For example, the primary bond coat could have a composition with elements that getter sulfur to improve the adhesion of the TGO scale while the secondary bond coats may contain increasing amounts of refractory elements to improve their high temperature properties and reduce their coefficient of thermal expansion (CTE). For the top coat composition, pore volume fraction and pore morphology may all be altered to optimize properties. The primary top coat layer may have a composition and pore morphology optimized for low thermal conductivity while the secondary top coats nearer the coating surface may be optimized for high temperature phase stability and sintering resistance. The final coating exposed to the engine environment could be optimized for erosion resistance. It should be appreciated that the composition of the layers and substrate material may be a variety of required or desired compositions and materials as disclosed throughout the associated teachings of the various embodiments of the present invention. Other combinations are possible including top coat zig-zag pore morphologies for lower thermal conductivity and foreign object damage (FOD) resistance, top-coats doped for in-situ temperature monitoring and bond coat compositions that resist molten salt corrosion (hot corrosion). FIG. 7 schematically illustrates a multilayered TBC coating having a primary bond coat and top coat and multiple secondary bond coats and top coats. Each of the bond coats and top coats has a different composition to give the coating improved properties. For instance, an exemplary embodiment may comprise TBC system structure 90 disposed on a substrate 92 having a bond coat 94 (primary) and thermal barrier coat layer 96 (primary), with a thermally grown oxide layer (TGO) 99 there between. Further, the embodiment may comprise multiple (i.e., a second layer or more) bond coat layers 94B-F (or having any desired or required material and compositions) and multiple (i.e., a second layer or more) thermal barrier coat layers 96B-F (having any desired or required material). Further it should be appreciated that the multiple layers may include thermally grown oxide (TGO) layers 99B-F, respectively.

TBC Processing Approach
Top Coat Deposition Approaches

To date, the lowest cost TBC top coats have been applied using plasma spray (PS) processes, such as an air plasma spray (APS). This approach employs a plasma torch to melt and spray deposit YSZ droplets onto airfoil substrates. These deposits contain disc-like pores in the plane of the coating resulting in a YSZ top layer that has a low thermal conductivity. This is due to the high thermal resistance of the pores oriented normal to the heat flow direction. Unfortunately, these layers also have poor spallation resistance, resulting from a combination of the disc-like coating defects and the large thermal expansion mismatch between the YSZ layer and the bond coat. This results in the failure of the coatings within the YSZ layer during service and results in a lack of reliability that limits these coatings to component life extension.

More recently, TBC's have been produced by electron beam-physical vapor deposition (EB-PVD). Using this technique the YSZ layer has a columnar microstructure with elongated inter-columnar voids aligned perpendicular to the substrate surface. This structure results in a low in-plane stiffness that limits thermomechanical stresses on heating/cooling and improved spallation resistance compared to the LPPS layers. The columns exhibit a tapered shape, growing wider with increased thickness, a faceted surface and a strong {200} crystallographic texture. Failure in these coatings no longer occurs within the YSZ layer but at the TGO/bond coat interface. This failure path appears to result from large stresses within the TGO layer, which increase with oxidation induced layer growth in service. For turbine blade applications, EB-PVD TBC's have the further advantages of limiting the undesirable blocking of air cooling holes during deposition and generating a smoother, more aerodynamic surface. However, EB-PVD coatings have a higher thermal conductivity than their LPPS counterparts and are more costly to apply (due to high equipment costs, deposition efficiencies of about 2-5 percent of the evaporated flux, and relatively slow (approximately 5 micrometers (μm) min$^{-1}$ deposition rates). To make vapor phase deposited TBC's a viable means for increasing engine performance, improved deposition techniques/strategies are needed.

The cost of the EB-PVD coatings can be as much as ten times that of PS coatings. The higher equipment costs of EB-PVD are a result of the high vacuum environment that is necessary during deposition (e.g., typically below 10$^{-6}$ Torr), high cost of high power electron beam guns, and sophisticated component manipulation needed to achieve acceptable coatings. The operating pressure defines the vacuum pump requirements with lower pressures generally needing more expensive pumps. The low deposition rate and low materials utilization efficiency (MUE) of EB-PVD is related to the distribution of the vapor flux as it leaves the evaporated source. Generally, the vapor flux spreads out from the source with a distribution described by a cos$^n$θ function (where n=2, 3, 4 or more, and θ is the angle to the normal axis). The general alignment of the normal axis is referred to herein as the main direction. When relatively long source-to-substrate distances are required (e.g., as in YSZ deposition using EB-PVD where this distance often approaches 50 cm to avoid substrate overheating) deposition efficiency is dramatically decreased to 1-5 percent of the evaporated flux and the deposition rate is proportionally reduced. To overcome the low deposition rate, the evaporation rate from the source materials is raised by increasing the electron beam power. However, this is costly and during YSZ evaporation, increased beam power leads to the production of molten droplets of material rather than atomistic vapor. This produces coating defects, and as a result, other approaches must be used to increase deposition rates. The high cost of deposition also impedes the use of physical vapor deposition methods for the deposition of bond coats.

Bond Coat Deposition Approaches

Current bond coats are based on either MCrAlY (where, M=Ni, Co) alloys or nickel aluminide intermetallics such as a platinum modified nickel aluminide. MCrAlY bond coats can be applied using either low-pressure plasma spray (LPPS), electron-beam physical vapor deposition (EB-PVD) or by sputtering. The aluminide bond coats are applied using a reaction-diffusion process. Several variants of the latter process have been developed. They include pack cementation, vapor phase aluminiding (VPA), and chemical vapor deposition (CVD). After deposition of aluminum and a high temperature reaction-diffusion annealing, these processes result in a bond coat with two distinct zones: an outer zone which contains an oxidation resistant β-NiAl phase and a diffusion zone near the bond coat-superalloy interface which consists of the oxidation resistant phase and various secondary phases (such as the Ni$_3$Al gamma prime, various carbides and sigma phases). These aluminide coatings are commonly called diffusion coatings.

Although these diffusion methods have successfully generated nickel aluminide layers, they require a prolonged thermal exposure of the coating-substrate system to form the appropriate (B2) intermetallic NiAl phase. When further alloying (for example addition of platinum) is required, an extra deposition process, such as electroplating, has to be appended to the fabrication process. This increases the complexity of the technical approach and introduces the opportunity for sample contamination. In those diffusion coatings, the nickel needed to form an intermetallic B2 phase comes from the substrate. Outward diffusion of elements from the substrate into the coating layer is therefore required. However, deleterious substrate alloy elements such as W, Ta, Ti or S can also then diffuse into the nickel aluminide layer. The high vapor pressure differences of elements Ni, Al and Pt make it difficult to create alloy coatings by evaporation of AlNiPt alloy targets.

SPS TBC Processing Concepts

There exists a need in the art for a cost-effective method to apply high quality TBC top coatings and bond coats to surfaces with improved control of the coating morphology and composition. To achieve this a novel directed vapor deposition (EB-DVD) approach exploits entrainment of the vapor in a controllable inert (e.g. helium or argon) carrier gas flow. In this approach, the combination of a continuously operating 60 kV/10 kW axial e-beam gun (modified to function in a low vacuum environment) and an inert carrier gas jet is used. Vaporized material is entrained in the carrier gas jet created using a converging/diverging nozzle configuration and deposited onto the substrate or target at high rate and with a high materials utilization efficiency. By using a high scan frequency electron beam gun, several different materials can be co-evaporated at independently controllable rates. This enables the creation of an alloy vapor plume of controllable composition. By using low density, high velocity gas jets, a homogeneous composition vapor flux can be achieved. The composition is easily manipulated by independently controlling the evaporation rate of each source.

Some of the applications of the assignee as previously listed have addressed this need to some extent by providing, among other things, a recipe of how to manipulate the process conditions in a EB-DVD systems to deposit high quality, highly efficient TBC top coats as well as how to deposit high quality bond coats of a given composition. Advanced processing approaches that enable improved cost-effectiveness and improved properties are still, however, required to take full advantage of these coating systems. Described below is a novel single processing sequence (SPS) approach for the deposition of thermal barrier coatings with multiple bond and top coats and compositionally and morphologically controlled interfaces between each layer.

An aspect of various embodiments of the present invention will, among other things, enable a significant cost reduction for the application of the TBC system and the deposition of novel TBC processing approaches that enable currently unobtainable TBC structures. The concepts are obtained because of a unique ability to deposit dense bond coats with controllable surface features and columnar top coats in a single deposition step (i.e. without removing the component from the vacuum system). This enables unique opportunities to tailor the bond coat/top coat interface by controlling the deposition parameters. It also enables a novel multilayer coating concept in which one (or more) secondary bond coats and top coats are used to protect a primary TBC from damage. Such concepts prevent unexpected damage in the primary TBC and prevent unexpected failures that now limit prime reliant use. In addition, this coating concept also enables the in-situ implementation of pulsed, high energy electron beam treating techniques that can result in the remelting and rapid solidification of very thin layers of a coating surface (about 10 μm to about 100 μm, while other exemplary coating surfaces may be, but not limited thereto, about 0.5 μm to about 5,000 μm). This results in refined grain structures that have been demonstrated to be effective in promoting the formation a slow, growing adherent alumina oxide scale and thus, is a potential tool for ensuring the proper bond coat/top coat interface is created during processing. This process would become an integral part of a new TBC manufacture process without adding significant cost.

DVD Processing for Single Step Coating of Engine Components with TBCs's

The DVD approach has been demonstrated to be capable of producing thick, high quality TBC's top coats at high rate and using reduced equipment costs. A schematic illustration of the coating approach for turbine blades and vanes is given in FIGS. 8 and 9. A unique gas jet nozzle/crucible has been designed that allows the vapor flux from multiple (co-evaporated) crucibles to be focused in one direction and intermixed in a second to create a vapor distribution that is uniformly elongated (12" long or greater, for example, but not limited thereto) along one axis but still focused along a second. This can be used to deposit bond coats and top coats onto very large parts with a high deposition efficiency and very high deposition rates or onto multiple components simultaneously.

FIG. 8(A) schematically illustrates of an elevation view of a crucible/gas jet nozzle configuration used for the high rate deposition of bond coat and top coat materials onto IGT parts or the like; while FIG. 8(B) illustrates the corresponding plan view. An aspect of the present invention, as shown in FIG. 8(A), is directed at coating one or more substrates (e.g., blades) at one time. It is often desirable to coat several blades at one time within the deposition chamber. This embodiment allows for using one or more sources 125, carrier gas streams 105, and nozzles 130 to focus vapor onto individual components. While FIG. 8(A) is a schematic illustration that shows one crucible/jet arrangement, it should be appreciated that multiple crucible/jet arrangement may be utilized as well. In a preferred embodiment, the nozzles include nozzle openings 131 and nozzle gaps 132 where carrier gas streams flow there from. The nozzle gaps 132 may be angular or non-angular (or combination thereof) having a variety of opening 131 of a variety of shapes, e.g., ring-shape. Each source is heated with an electron beam (using, for example, either single beam scanning gun or multiple e-beam guns) and the vapor is directed onto a turbine blade 20 at high efficiency and rate. The vapor flux distribution 115 may be adjusted to being equal to, less than or greater that the size of the blade or target 20. In an approach, multiple blades or targets may be simultaneously coated at high rate (or desired rate) to result in a very high (or desired) process throughput. Steering of the vapor is accomplished using non-angular or angular symmetric nozzles. In one approach, an additional electron beam (not shown) may employed for each source 125. A method also is to use the high frequency scanning capability of the electron beam to maintain evaporation from many sources simultaneously.

As discussed above, it is also recognized that nozzle shapes other than ring-shaped may be useful. As shown in FIG. 8(B), in an aspect of the present invention, alternative embodiments may utilize variety of ring gap shapes, segments or contours. For instance, FIG. 8(B) illustrates generally rectangular nozzle/ring opening 131 of a nozzle 130 about the evaporant source(s) 125 to provide a desired vapor flux distribution. This may be of interest and adjusted to according to the surface coating criteria. For example, but not limited thereto, for non-circular shaped substrates such as turbine blades, in which a higher deposition efficiency can be realized if the shape of the vapor flux distribution is tailored to the size and shape of the part to be coated. This approach allows for one to not only apply a coating to the desired area of the part, but also to prevent coating on an area that requires subsequent part manipulation tooling or locations on the part which do not require a turbine blade.

Turning to FIG. 9, FIG. 9 schematically illustrates a production coating concept that will enable the single-step deposition of a complete TBC system as well as advanced multi-layer TBC structures. The coater uses an advanced electron beam gun that can be deflected at very large angles (+/−30°. While FIG. 9 illustrates a single electron beam gun, it should be appreciated that a plurality of electron beam guns (energetic beam source) may be utilized. This allows a single e-beam gun 103 to be used to evaporate from multiple sources 125, which need not be located in the same chamber. This enables a dual chamber design 104A, 104B (more chambers are also possible as desired or required). This allows the single step deposition of both the bond coat and the top coat, as well as the deposition of multiple bond and top coats onto a single component 20 as required to create prime reliant multi-layered structures. In the later case, the component 20 is simply moved back and forth from the bond coat chamber (e.g., 104A) to the top coat chamber (e.g., 104B) to produce as many bond coat/ top coat combinations as required. The flexible e-gun capabilities will also allow e-beam treatments of the bond coat surface prior to top coat deposition, which may occur in an intermediate chamber 104C. This set-up would enable a turbine component to be entered into the coater without any coating and leave the coater with both the bond coat and the top coat (i.e. the entire TBC system) applied on the component. This approach maximizes the use of the equipment required for coating (capital costs for bond coat deposition are mostly shared by the top coat equipment), significantly decreases the time required for coating, reduces the man-power requirements, reduces the footprint of the equipment and thus results in a much lower deposition cost for the TBC system. The cost of depositing a top coat and a bond coat using DVD is anticipated to be less than the cost of depositing just a top coat using a conventional EB-PVD approach.

Additionally, for some bond coat compositions significantly thinner bond coats can be applied using this approach because no out-of-the-chamber part handling is required in-between the top coat and bond coat deposition. This part handling creates the risk of damaging very thin bond coats (about 5 to about 10 microns) leading to the use of thicker coatings. The high cost of some bond coat elements (such as platinum) makes the use of the thinnest coating possible the most cost effective approach.

Additionally, it is also possible to alter the composition and microstructure of each layer that is deposited by using multiple vapor sources in both the bond coat and top coat chamber. This would enable the bond coat and top coat layer composition to be tailored to its position in the coating. For example, near the substrate bond coats that getter sulphur may and have a high CTE may be employed. Near the coating surface, more refractory bond coats with lower CTE's and enhanced high temperature properties could be used. For the top coat, materials with low thermal conductivity and tailored pore morphologies may be used nearer the substrate while more erosion and sintering resistant materials with higher temperature stability being used closer to the coating surface. The coating composition can be altered by using multiple source evaporation and varying the gun power to each source during each subsequent layer. The pore volume fraction and morphology can be altered by altering the chamber pressure, the gas jet pressure ratio and/or the substrate temperature or altering the parameters of a plasma activation system.

Figure 10A:
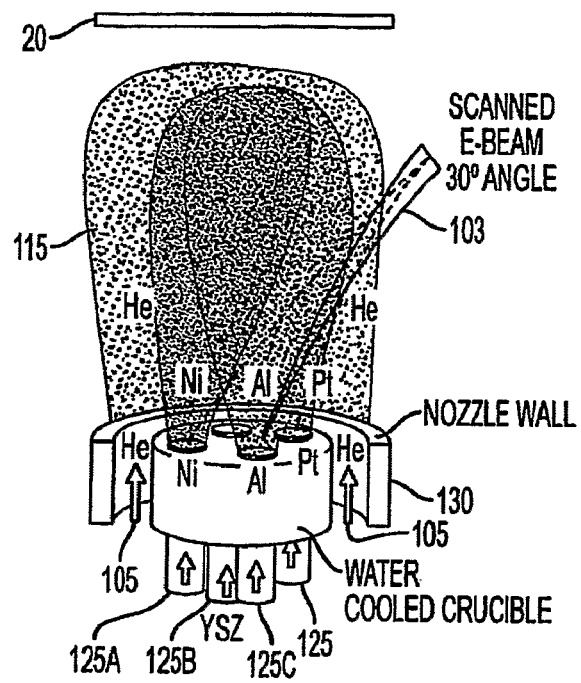
FIG. 10(A) is a schematic illustration showing the multi-source evaporation crucible/nozzle configuration to be used during this task. The bond coat deposition portion of the processing sequence is shown where Ni, Al and Pt will be evaporated.
Figure 10B:
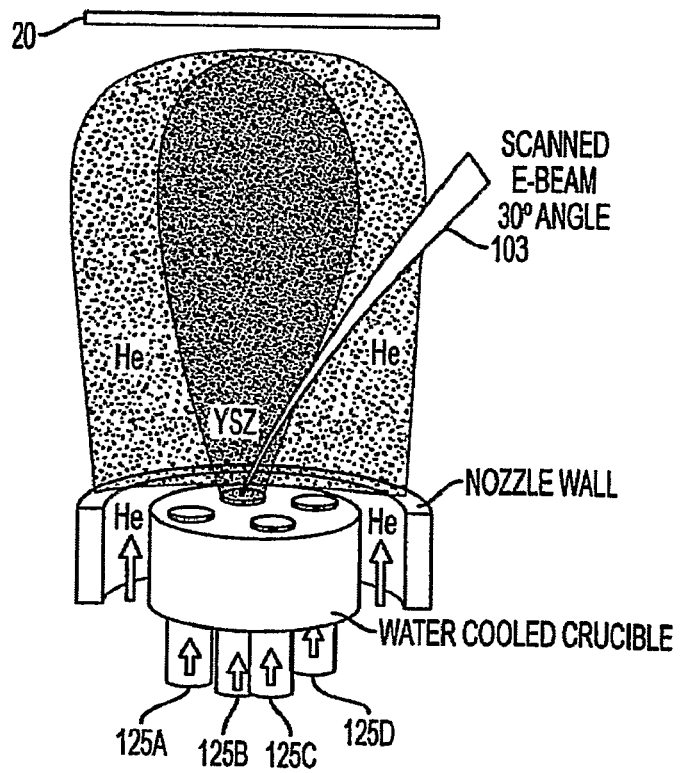
FIG. 10(B) is a schematic illustration of the corresponding multi-source evaporation crucible/nozzle configuration to be used during this task, wherein the e-beam scanning pattern has been altered to evaporate the YSZ source.

Single-Step TBC Deposition:

Turning to FIG. 10(A), in some cases, a single chamber approach (should note that this is a possibility) for single step TBC deposition is also possible. For example, a platinum aluminide bondcoat and a 7YSZ top coat could be deposited onto a superalloy substrate in a single deposition step by using a water-cooled crucible having Pt, Ni, Al and YSZ source rods. The substrate will be heated to temperatures (~1050° C., while other exemplary temperatures may be, but not limited thereto, about 500° C. to about 1250° C. to,) where dense PtNiAl coatings have been demonstrated. The bond coat will be created by co-evaporating the Pt, Ni and Al metals for the bond coat. The use of high frequency e-beam scanning (e.g., 100 kHz, but not limited thereto) allows multiple source rods to be simultaneously evaporated. Evaporation rates will be set to yield the desired composition by altering the electron beam power to each source and using process conditions that promote vapor phase mixing of the materials. Turning to FIG. 10(B), after deposition of the bond coat the e-beam scanning pattern will be altered to evaporate only the 7YSZ source rod and the top coat will be created. The entire process may occur without cooling the part or breaking the chamber vacuum. As is the case with current TBCs, the TGO will form in service. FIG. 10 schematically illustrate a multi-source evaporation crucible/nozzle configuration to be used during this task or the like. In FIG. 10(A) the bond coat deposition portion of the processing sequence is shown where Ni, Al and Pt will be evaporated. In FIG. 10(A) the e-beam scanning pattern has been altered to evaporate the YSZ source. As illustrated in FIG. 10, there is provided an alternative embodiment, wherein vapor phase mixing can be achieved by aligning two (or potentially more) sources 125A, 125B, 125C, 125D (evaporant materials A, B, C &/or D, etc.) in line with a carrier gas flow 105 and using electron beam scanning 103 to uniformly heat both (or plurality of) sources (optionally, may be achieved with one evaporant source). The use of the carrier gas jet in this embodiment not only scatters the vapor flux toward the substrate 20, leading to a potentially high MUE (and high deposition rates), but also randomizes the vapor trajectory facilitating vapor phase mixing of the two (or plurality of) fluxes 115. A high materials utilization efficiency (MUE) would allow for the use of small diameter metal source materials, which could be spaced closely together to further improve the compositional uniformity of the coating, while still achieving a high rate of deposition. The composition of the deposited layer could be systematically controlled by altering the electron beam scan pattern to change the surface temperature (and thus the evaporation rate) of each source material.

In one embodiment, the electron beam gun in the directed vapor deposition system has been equipped with a high speed e-beam scanning system (up to about 100 kHz, for example, but not limited thereto) with a small beam spot size (<about 0.5 mm, but not limited thereto) to allow multiple crucibles to be placed in close proximity to one another for precise heating and vapor mixing. The carrier gas surrounds the vapor sources and allows the vapor from the neighboring melt pools to interdiffuse. The composition of the deposited layer can then be controlled by altering the electron beam scan pattern to change the temperature (and thus the evaporation rate) of each source material. In effect this is a splitting of the beam into two or more beams (if two or more sources) with precisely controllable power densities. As a result, the present invention DVD system enables the evaporation of several materials simultaneously and thus, precise composition control in the coating can be achieved. Using a 100 kHz scan rate, a single e-beam can be scanned across multiple, closely-spaced vapor sources for precise alloy or multilayer deposition. The water-cooled copper crucible and independent source feed motors make possible independent material feed and evaporation. The setup is shown schematically for Ni, Y, Al, Pt, and/or He, evaporation. A single e-beam can be scanned across multiple, closely-spaced vapor sources for precise alloy or multilayer deposition. The water-cooled copper crucible and independent source feed motors make possible independent material feed and evaporation The following references are hereby incorporated by reference herein in their entirety:
1. D. D. Hass, Ph.D. Dissertation, University of Virginia (2000).
2. D. D. Hass, P. A. Parrish and H. N. G. Wadley, J. Vac. Sci. Technol. A 16(6) (1998) p. 3396.
3. D. D. Hass, A. J. Slifka, H. N. G. Wadley, Acta. Mater., 49 (2001) 973.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes, which come within the meaning and range of equivalency of the claims, are therefore intended to be embraced herein.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. A method for forming a thermal barrier coating system in communication with at least a portion of at least one substrate, said method comprising:
   depositing a bond coat on at least a portion of said substrate;
   depositing a thermal barrier coat on said bond coat; and
   depositing a second bond coat on said thermal barrier coat, said second bond coat comprising a material having a coefficient of thermal expansion (CTE) of greater than $10 \times 10^{-6}$;
   wherein said bond coat, said thermal barrier coat, and second bond coat are deposited using at least one of the following deposition techniques comprising:
   directed vapor deposition (DVD), evaporation (thermal, RF, laser, or electron beam), reactive evaporation, sputtering (DC, RF, microwave and/or magnetron), reactive sputtering, electron beam physical vapor deposition (EF-PVD), ion plasma deposition (IPD), low pressure plasma spray (LPPS), high velocity oxy-fuel (HVOF), vapor deposition, cluster deposition, cathodic arc deposition, or jet vapor deposition, or any combination thereof.

2. A method for forming a thermal barrier coating system in communication with at least a portion of at least one substrate, the method comprising:
   depositing a first bond coat on at least a portion of said substrate;
   depositing a first thermal barrier coat on said first bond coat;
   depositing a second bond coat on said first thermal barrier coat; and
   depositing a second thermal barrier coat on said second bond coat;
   wherein said bond coats and said thermal barrier coats are deposited using directed vapor deposition (DVD).

3. The method of claim 2, wherein said method further comprises:
   presenting said substrate to a chamber, wherein said chamber has a down stream pressure, Pc, with an operating range from about 0.0001 Pa to about 150 Pa;
   presenting at least one evaporant source to said chamber for said bond coats;
   presenting at least one evaporant source to said chamber for said thermal barrier coats;
   presenting at least one carrier gas stream to said chamber, wherein said carrier gas stream is generated from at least one nozzle;
   impinging at least one evaporant bond coat source with at least one energetic beam in said chamber to generate an evaporated bond coat vapor flux in a main direction respective for any of said evaporant sources impinged by said energetic beam;
   impinging at least one evaporant thermal barrier coat source with at least one energetic beam in said chamber to generate an evaporated thermal barrier coat vapor flux in a main direction respective for any of said evaporant sources impinged by said energetic beam;
   said at least one carrier gas stream has a pressure ratio in the operating range from about 1.01 to about 10,000,000;
   said substrate having a temperature approximately equal to or greater than a melting point of said substrate;

said at least one evaporant bond coat source and said at least one evaporant thermal barrier coat source generate said evaporated vapor flux and an evaporation rate in the range of about 0.00001 g/min to about 100,000 g/min; and deflecting at least one of said generated evaporated bond coat vapor flux and said generated evaporated thermal barrier coat vapor flux by said carrier gas stream, wherein said carrier gas stream is essentially parallel to the main direction and substantially surrounds said evaporated bond coat flux and said generated evaporated thermal barrier coat vapor flux, wherein said evaporated vapor bond coat flux at least partially coats said substrate to provide a bond coat and said generated evaporated thermal barrier coat vapor flux at least partially coats said bond coat to provide a thermal barrier coat.

4. The method of claim 3, wherein said deposition of said first bond coat and said deposition of said first thermal barrier coat is performed without removing said thermal barrier coating system from said chamber.

5. The method of claim 3, further comprising:
said chamber further includes a substrate bias system capable of applying a DC or alternating potential to at least one of said substrates;
impinging said at least one of said generated vapor bond coat flux, said at least one of said generated vapor thermal barrier coat flux and at least one of said carrier gas stream with a working gas generated by at least one hollow cathode arc plasma activation source to ionize said at least one of said generated vapor bond coat flux, said at least one of said generated vapor thermal barrier coat flux and at least one of said carrier gas stream; and
attracting said ionized generated vapor bond coat flux, said at least one of said generated vapor thermal barrier coat flux and said carrier gas stream to a substrate surface by allowing a self-bias of said ionized gas and vapor stream or said potential to pull the ionized stream to said substrate.

6. The method of claim 5, wherein said generated electrons from said hollow cathode source are regulated for direction through variations in the quantity of working gas passing through said hollow cathode source.

7. The method of claim 5, wherein the distance between said cathode source and said generated evaporated vapor flux is regulated for ionization of the entire generated evaporated vapor flux.

8. The method of claim 3, wherein said energetic beam comprises at least one of electron beam source, laser source, heat source, ion bombardment source, highly focused incoherent light source, microwave, radio frequency, EMF, or any energetic beam that break chemical bonds, or any combination thereof.

9. The method of claim 3, further comprising: at least one nozzle including at least one nozzle gap wherein said carrier gas flows therefrom; and
at least one evaporant retainer for retaining said at least one evaporant source, said evaporant retainer being at least substantially surrounded by said nozzle gap.

10. The method of claim 9, wherein said evaporant retainer is a crucible.

11. The method of claim 9, wherein at least one said nozzle gap is defined by a shape selected from the group consisting of: ring-shaped, elliptical-shaped, elongated elliptical-shaped, cross-hatch-shaped, segmented ring-shaped, segmented elliptical-shaped, and segmented elongated elliptical-shaped.

12. The method of claim 9, further comprising:
providing a plurality of said nozzles, wherein said nozzle gaps being non-angular channels; and
providing a plurality of said energetic beams, wherein individual energetic beams impinge on individual sources to generate evaporated vapor flux to at least partially coat a plurality of said substrates, each of said substrates being coated respectively from a singular evaporant source.

13. The method of claim 9, further comprising:
providing a plurality of said nozzles, wherein said nozzle gaps being non-angular channels; and
providing a plurality of said energetic beams, wherein individual energetic beams impinge on individual sources to generate evaporated vapor flux to at least partially coat a singular said substrate, said substrate being coated from a plurality of said evaporant sources.

14. The method of claim 9, further comprising:
providing a plurality of said nozzles, wherein said nozzle gaps being angular channels; and
providing a singular electron beam, wherein said electron beam impinges on individual said sources to generate evaporated vapor flux to at least partially coat a plurality of said substrates, each of said substrates being coated respectively from a singular said evaporant source.

15. The method of claim 9, further comprising:
providing a plurality of said nozzles, wherein said nozzle gaps being angular channels; and
providing a singular electron beam, wherein said singular electron beam impinges on individual evaporant sources to generate evaporated vapor flux to at least partially coat a singular said substrate, said substrate being coated from a plurality of said evaporant sources.

16. The method of claim 3, wherein:
said evaporant bond coat sources have substantially the same chemical composition relative to one another; and
said evaporant thermal barrier coat sources have substantially the same chemical composition relative to one another.

17. The method of claim 3, wherein:
said evaporant bond coat sources have substantially the same chemical composition relative to one another; and
said evaporant thermal barrier coat sources have substantially different chemical composition relative to one another.

18. The method of claim 17, further comprising:
combining at least two of said evaporant thermal barrier coat sources after impingement but prior to reaching said substrates.

19. The method of claim 3, wherein:
said evaporant bond coat sources have substantially different chemical compositions relative to one another; and
said evaporant thermal barrier coat sources have substantially different chemical compositions relative to one another.

20. The method of claim 19, further comprising:
combining at least two of said evaporant bond coat sources after impingement but prior to reaching said substrates.

21. The method of claim 19, further comprising:
combining at least two of said evaporant thermal barrier coat sources after impingement but prior to reaching said substrates.

22. The method of claim 3, wherein:
said evaporant bond coat sources have substantially different chemical composition relative to one another; and
said evaporant thermal barrier coat sources have substantially same chemical composition relative to one another.

23. The method of claim 22, further comprising:
combining at least two of said evaporant bond coat sources after impingement but prior to reaching said substrates.

24. The method of claim 9, wherein:
said evaporant bond coat source is disposed in said nozzle; and/or
said evaporant thermal barrier coat source is disposed in said nozzle.

25. The method of claim 9, wherein:
said evaporant bond coat source is disposed in proximity to said nozzle; and/or
said evaporant thermal barrier coat source is disposed in proximity to said nozzle.

26. The method of claim 3, further comprising:
moving said substrate before and/or during said depositing.

27. A method for forming a thermal barrier coating system in communication with at least a portion of at least one substrate, the method comprising:
depositing a first bond coat on at least a portion of said substrate;
depositing a first thermal barrier coat on said first bond coat;
depositing a second bond coat on said first thermal barrier coat;
depositing a second thermal barrier coat on said second bond coat; and
wherein said bond coats and said thermal barrier coats are deposited without exposing said thermal barrier coating system to atmospheric conditions.

28. The method of any one of claims 1, 2 and 27, wherein:
said first bond coat and said first thermal barrier coat are deposited while in a single chamber.

29. The method of claim 28, wherein said deposition of said first bond coat and said deposition of said first thermal barrier coat are performed without removing said thermal barrier coating system from said chamber.

30. The method of any one of claims 1, 2, and 27, further comprising:
impinging said first bond coat with an energetic beam prior to depositing said first thermal barrier coating to provide energetic treatment.

31. The method of any one of claims 1, 2 and 27, wherein:
said first bond coat is deposited in a first chamber; and
said first thermal barrier coat is deposited in a second chamber.

32. The method of claim 31, further comprising:
impinging said first bond coat with an energetic beam prior to depositing said first thermal barrier coating to provide energetic treatment.

33. The method of claim 32 wherein said energetic beam treatment of said first bond coat occurs in an intermediate chamber.

34. The method of any one of claim 1, 2 or 27, wherein:
said first thermal barrier coat comprises a material derived from at least one evaporant thermal barrier coat source; and
a portion of said first thermal barrier coat being deposited on a non-line of sight region of said first bond coat relative to at least one said evaporant thermal barrier coat source.

35. The method of any one of claim 1, 2, or 27, wherein:
said first bond coat comprises a material derived from at least one evaporant bond coat source; and
a portion of said first bond coat being deposited on a non-line of sight region of said substrate relative to at least one said evaporant bond coat source.

36. The method of claim 35, wherein:
said first thermal barrier coat comprises a material derived from at least one evaporant thermal barrier coat source; and
a portion of said first thermal barrier coat being deposited on a non-line of sight region of said first bond coat relative to at least one said evaporant thermal barrier coat source.

37. The method of any one of claims 2 or 27, further comprising:
depositing a sealing layer on said second thermal barrier coat.

38. The method of claim 37, wherein said sealing layer comprises a third bond coat.

39. The method of claim 38, wherein:
said second bond coat comprises a material derived from at least one said evaporant bond coat source; and
a portion of said second bond coat being deposited on a non-line of sight region of said first thermal barrier coat relative to at least one said evaporant bond coat source.

40. The method of claim 35, wherein:
said second thermal barrier coat comprises a material derived from at least one said evaporant thermal barrier coat source; and
a portion of said second thermal barrier coat being deposited on a non-line of sight region of said first bond coat relative to at least one said evaporant thermal barrier coat source.

41. The method of claim 35, wherein:
said second bond coat and said second thermal barrier coat are deposited in a single chamber.

42. The method of claim 41, wherein said deposition of said second bond coat and/or said deposition of said second thermal barrier coat is performed without removing said thermal barrier coating system from said chamber.

43. The method of claim 35, wherein said properties of said first bond coat and/or first thermal barrier coat have the same material properties as said second bond coat and/or second thermal barrier coat, respectively.

44. The method of claim 35, wherein said properties of said first bond coat and/or first thermal barrier coat have different material properties as said second bond coat and/or second thermal barrier coat, respectively.

45. The method of claim 35, further comprising:
depositing one or more additional alternating layers of bond coat and thermal barrier coat to said second thermal barrier coat.

46. The method of claim 45, wherein said properties of said first bond coat and/or first thermal barrier coat, said second bond coat and/or second thermal barrier bond coat, and/or said additional bond coat and/or additional thermal barrier coat have the same material properties for respective bond coat and thermal barrier coat layers.

47. The method of claim 45, wherein said properties of said first bond coat and/or first thermal barrier coat, said second bond coat and/or second thermal barrier bond coat, and/or said additional bond coat and/or additional thermal barrier coat have different material properties for respective bond coat and thermal barrier coat layers.

48. The method of claim 35, further comprising:
impinging said second bond coat with an energetic beam prior to depositing said second thermal barrier coating to provide energetic beam treatment.

49. The method of claim 31, wherein:
said second bond coat is deposited while in said first chamber; and said second thermal barrier coat is deposited while in said second chamber.

50. The method of claim 49, further comprising:
impinging said second bond coat with an energetic beam prior to depositing said second thermal barrier coating to provide energetic beam treatment.

51. The method of claim 50, wherein said energetic beam treatment of said second bond coat occurs in an intermediate chamber.

52. A method for forming a thermal barrier coating system in communication with at least a portion of at least one substrate, the method comprising:
depositing a first bond coat on at least a portion of said substrate;
depositing a first thermal barrier coat on said first bond coat;
depositing a second bond coat on said first thermal barrier coat; and
depositing a second thermal barrier coat on said second bond coat; wherein
said deposition occurs in one or more chambers to form said thermal barrier coating system; and
said deposition of said deposition of said first bond coat and said deposition of said first thermal barrier coat is performed without out-of-chamber handling of said thermal barrier coating system.

53. The method of claim 52, wherein:
said first bond coat and said first thermal barrier coat are deposited while in said chamber, wherein said chamber is a single chamber.

54. The method of claim 53, wherein said deposition of said second bond coat and/or said deposition of said second thermal barrier coat is performed without removing said thermal barrier coating system from said chamber.

55. The method of claim 52, further comprising:
impinging said first bond coat with an energetic beam prior to depositing said first thermal barrier coating to provide energetic treatment.

56. The method of claim 52, wherein:
said first bond coat is deposited in said chamber; and
said first thermal barrier coat is deposited in a second chamber.

57. The method of claim 56, further comprising:
impinging said first bond coat with an energetic beam prior to depositing said first thermal barrier coating to provide energetic treatment.

58. The method of claim 57, wherein said energetic beam treatment of said first bond coat occurs in an intermediate chamber.

59. The method of claim 52, wherein:
said first thermal barrier coat comprises a material derived from at least one evaporant thermal barrier coat source; and
a portion of said first thermal barrier coat being deposited on a non-line of sight region of said first bond coat relative to at least one said evaporant thermal barrier coat source.

60. The method of claim 59, wherein:
the down stream pressure, Pc, of said chamber has an operating range from about Pa to about 133 Pa.

61. The method of claim 52, wherein:
said first bond coat comprises a material derived from at least one evaporant bond coat source; and
a portion of said first bond coat being deposited on a non-line of sight region of said substrate relative to at least one said evaporant bond coat source.

62. The method of claim 61, wherein:
said first thermal barrier coat comprises a material derived from at least one evaporant thermal barrier coat source; and
a portion of said first thermal barrier coat being deposited on a non-line of sight region of said first bond coat relative to at least one said evaporant thermal barrier coat source.

63. The method of claim 61, wherein:
the down stream pressure, Pc, of said chamber has an operating range from about 1 Pa to about 133 Pa.

* * * * *